United States Patent
Berntorp et al.

(10) Patent No.: US 11,501,193 B2
(45) Date of Patent: Nov. 15, 2022

(54) MODEL-BASED CONTROL UNDER UNCERTAINTY

(71) Applicant: Mitsubishi Electric Research Laboratories, Inc., Cambridge, MA (US)

(72) Inventors: Karl Berntorp, Watertown, MA (US); Stefano Di Cairano, Newton, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 1367 days.

(21) Appl. No.: 15/845,134

(22) Filed: Dec. 18, 2017

(65) Prior Publication Data
US 2019/0188592 A1 Jun. 20, 2019

(51) Int. Cl.
*G06N 7/00* (2006.01)
*G06F 17/18* (2006.01)
(Continued)

(52) U.S. Cl.
CPC ........... *G06N 7/005* (2013.01); *G05B 13/048* (2013.01); *G06F 17/18* (2013.01); *G01S 19/01* (2013.01);
(Continued)

(58) Field of Classification Search
CPC ...... G06N 7/005; G06N 7/023; G05B 13/048; G05B 2219/41146; G06F 17/18; G01S 19/01; G01S 19/48; H03H 17/0257
See application file for complete search history.

(56) References Cited

U.S. PATENT DOCUMENTS

| 6,738,682 B1 | 5/2004 | Pasadyn |
| 7,180,443 B1 | 2/2007 | Mookerjee et al. |
| (Continued) | | |

FOREIGN PATENT DOCUMENTS

CN 103020348 B 12/2012

OTHER PUBLICATIONS

Huang Yulong et al., "A Novel Robust Student's t-based Kalman Filter," IEEE Transactions on Aerospace and Electronics Systems, IEEE Service Center, Piscataway, NJ, US, vol. 53, No. 3, Jun. 1, 2017. pp. 1545-1554.

(Continued)

*Primary Examiner* — Casey R. Garner
(74) *Attorney, Agent, or Firm* — Gennadiy Vinokur; Hironori Tsukamoto

(57) ABSTRACT

An apparatus for controlling a system includes a memory to store a model of the system including a motion model of the system subject to process noise and a measurement model of the system subject to measurement noise, such that one or combination of the process noise and the measurement noise forms an uncertainty of the model of the system with unknown probabilistic parameters, wherein the uncertainty of the model of the system causes a state uncertainty of the system with unknown probabilistic parameters. The apparatus also includes a sensor to measure a signal to produce a sequence of measurements indicative of a state of the system, a processor to estimate a Gaussian distribution representing the state uncertainty, and a controller to determine a control input to the system using the model of the system with state uncertainty represented by the Gaussian distribution and control the system according to the control input. The processor is configured to estimate, using at least one or combination of the motion model, the measurement model, and the measurements of the state of the system, a (Continued)

first Student-t distribution representing the uncertainties of the model and a second Student-t distribution representing the state uncertainty of the system, the estimation is performed iteratively until a termination condition is met, and fit a Gaussian distribution representing the state uncertainty into the second Student-t distribution.

19 Claims, 21 Drawing Sheets

(51) Int. Cl.
*G05B 13/04* (2006.01)
*G01S 19/48* (2010.01)
*G01S 19/01* (2010.01)
*G06N 7/02* (2006.01)
*H03H 17/02* (2006.01)

(52) U.S. Cl.
CPC ..... *G01S 19/48* (2013.01); *G05B 2219/41146* (2013.01); *G06N 7/023* (2013.01); *H03H 17/0257* (2013.01)

(56) References Cited

U.S. PATENT DOCUMENTS

| | | | |
|---|---|---|---|
| 7,209,938 B2 | 4/2007 | Lipp | |
| 9,285,787 B2 | 3/2016 | Gallestey et al. | |
| 2005/0114023 A1* | 5/2005 | Williamson | G01S 19/47 701/472 |
| 2015/0279031 A1 | 10/2015 | Cavusoglu et al. | |
| 2016/0357169 A1* | 12/2016 | Di Cairano | G05B 13/048 |
| 2020/0293594 A1* | 9/2020 | Raissi | G06N 20/10 |

OTHER PUBLICATIONS

Roth et al., "Robust Bayesian Filtering and Smoothing using Student's t Distribution," Arxiv.org, Cornell University Library, 201 Olin Library, Ithaca, NJ, 14853. Mar. 7, 2017.

Sarkka et al., "Recursive Noise Adaptive Kalman Filtering by Variational Bayesian Approximations," IEEE Transactions on Automatic Control, IEEE Service Center, Los Alamitos, CA, US, vol. 54, No. 3, Mar. 1, 2009. pp 596-600.

Bemtorp et al., "Approximate Noise Adaptive Filtering using Student t Distributions," 2018 Annual American Control Conference, Jun. 27, 2018. pp 2745-2750.

* cited by examiner

MODEL-BASED CONTROL UNDER UNCERTAINTY

FIELD OF THE INVENTION

This invention relates to control of a system, and more specifically to controlling a system using a model of system dynamics having uncertainty.

BACKGROUND

Many advanced control techniques are formulated as optimization problems, which can be solved by a control system in real time. Based on a type of a model describing dynamics of the system, some systems are commonly referred as linear or nonlinear systems. For example, a linear system is a model of a system based on the use of a linear operator. Linear systems typically exhibit features and properties that are much simpler than the nonlinear case and find important applications in automatic control theory, signal processing, and telecommunications. For example, the propagation medium for wireless communication systems can often be modeled by linear systems, and the motion of a road vehicle can be described by a linear system under certain conditions on the driver and/or control system.

The performance of a model-based control inevitably depends on the quality of the prediction model used in the optimal control computation. However, in many applications the model of the controlled system is partial unknown or uncertain. In such cases the application of the control on the uncertain model can lead to suboptimal performances or even to instability of the controlled system.

The Kalman filter (KF) is the standard tool for state estimation in linear state-space models. The states can relate to the physical variables of a dynamical system, such as position, velocity, orientation, a combination of them, or flow, but can also be nonphysical if the model has been obtained using black-box estimation models. It is the best linear unbiased filter in the minimum-variance sense, and for Gaussian noise it is the optimal Bayesian filter. The KF is a real-time recursive method that propagates the mean and variance of the state estimate, which for known Gaussian noise is the amount of information, the sufficient statistics, needed to estimate the full probability distribution of the system. The classical formulation of the KF assumes that the noise processes are Gaussian and have known mean and covariance, which can be severely limiting.

Model uncertainties and possible data outliers affect the performance of the KF, and in many practical cases, the model parameters are unknown, or at least uncertain. For instance, in navigation systems where inertial sensing and/or GPS is used, the noise statistics often have temporal dependence that cannot be determined a priori. Other examples are changing noise statistics due to linearization errors in approximated nonlinear models, environment dependent sensor statistics, and outliers in unreliable sensors that the Gaussian distribution handles poorly because of its low probability mass in the tails. The noise parameters determine the reliability of the different parts of the model and are therefore of particular importance for the filter performance. However, manual tuning of the noise parameters, as is often done in practice, can be a challenging, time consuming, and tedious task.

Due to the infeasibility of exact approaches to noise parameter estimation, approximate methods are devised. For example, a method described in U.S. Pat. No. 7,209,938B2 discloses a KF in combination with a variance estimator to estimate the state of a dynamical system and associated variance of the measurement noise. However, this method is sensitive to outliers, which is a common case in, but not restricted to, GPS/inertial sensing based estimation systems.

Other approaches are based on augmenting the state vector to include the parameters of uncertainty of the model, such as mean and variance of the noise. However, such an approach leads to an estimation problem that is unnecessarily complex, since the state vector is larger than it needs to be. Furthermore, such an approach is dependent on introducing a model of the dynamical evolution of the parameters, which in reality is unknown.

Accordingly, there is a need for a model-based control of a system using a model of dynamics of the system that includes uncertainty.

SUMMARY

Typically, a model of the system includes two models (equations). The first model is a motion model of the system relating a state of the system to a previous state of the system and an input to the system. The motion model typically includes noise or disturbance representing uncertainty of the motion model. This uncertainty is referred herein as process noise. The second model is a measurement model relating available measurements of the system to the state of the system. The measurement model also includes measurement noise and/or other uncertainties referred herein as measurement noise.

Example of the motion model is $x_{k+1}=Ax_k+w_k$, wherein $w_k$ is the process noise. Also, example of the measurement model is $y_k=Cx_k+e_k$, wherein $e_k$ is the measurement noise.

In addition, the state of the system is also subject to uncertainty, referred herein as a state uncertainty. Notably, the process noise and the measurement noise cause the state uncertainty, however, the state uncertainty is different from the process and measurement noises. Specifically, the state uncertainty is internal to the values of the state while the process and measurement noises are external disturbance on the state.

When the process noise and the measurement noise are known, i.e., the shape and parameters of the distribution of the process noise and the measurement noise are known, various techniques allow to estimate both the state of the system and the state uncertainty. Both the state of the system and the state uncertainty is important for a number of control applications. For example, the state of the system can be used to determine a control input to the system to accomplish a control objective, while the state uncertainty can be used to adjust the control input to ensure the feasibility of the control.

For example, when the distributions of the process noise and the measurement noise are Gaussian, and the mean and the variance of the Gaussian distribution for the process and measurement noise are known, the Kalman filter can be used to estimate both the state of the system and the state uncertainty. However, when the variance of the Gaussian distribution for at least one of the process and measurement noise is unknown, the Kalman filter is not applicable. To that end, it is beneficial for a number of control applications to know probabilistic parameters of the distributions of the process noise and the measurement noise.

Some embodiments are based on the understanding that it is possible to represent an unknown probabilistic parameter with an average expected value. However, in many situations, the probabilistic parameters are changing over time, and using the average expected value would result in having constant value of the probabilistic parameter, which can be suboptimal.

To that end, there is a need to estimate for a system and method for estimating probabilistic parameters of distribution of at least one or combination of process noise and the measurement noise as a function of time.

Some embodiments are based on recognition that when the probabilistic parameters of a distribution are unknown, it is reasonable to assume that the distribution is a Gaussian distribution. This assumption is, for example, justified by the law of large numbers. For instance, an accelerometer has high-frequency noise components that when measured at a fixed sampling-rate resembles a Gaussian probability distribution.

Some embodiments are based on another recognition that it is possible to estimate unknown probabilistic parameters of the Gaussian distribution, such as mean and variance. For example, due to symmetry of the Gaussian distribution, the variance of the Gaussian distribution can be estimated using an average of variations of the data samples.

However, some embodiments are based on realization that when the variance of the Gaussian distribution of the process noise and/or the measurement noise is unknown, the distribution of the process noise and/or the measurement noise should be Student-t distribution, even when the actual distribution of the process noise and/or the measurement noise is Gaussian. This is because, the Student-t distribution can better capture the uncertainty of the unknown variance of the Gaussian distribution. Unfortunately, however, the Student-t distribution is ill-suited for a number of control methods. That is, if the state of the system is represented with the Student-t distribution, a number of the assumptions when devising the control methods would be violated. For instance, many control systems, such as Linear Quadratic Gaussian controllers (LQG), rely on a Gaussian assumption of the process and measurement noise to provide stability guarantees.

To that end, some embodiments perform several transformations between the Gaussian and Student-t distributions to capture both the Gaussian nature of the process and the uncertainty of the Gaussian nature. Such a transformation allows to consider the uncertainty of Gaussian distribution in various control methods that are not designed to consider Student-t distributions. For example, one embodiment determines initial estimates of the mean and the variance of the Gaussian noise, and thereby fits the parameters of a Student-t distribution to the Gaussian distribution. Another embodiment iteratively estimates the parameters of a Student-t distribution, namely the mean, the scale, and the degree of freedom, and fits a Gaussian distribution to the Student-t distribution. Doing in such a manner results in consistency with the Gaussian noise assumption but still accounts for the uncertainties in the mean and the variance of the Gaussian distribution.

As time progresses, the Student-t distribution approaches the Gaussian. One embodiment is based on the understanding that it can be beneficial to avoid this merging. Consequently, the embodiment restricts the parameters of the Student-t distribution such that the Student-t and Gaussian are sufficiently close to each other, but not exactly the same.

Some embodiments are based on the understanding that the state of the dynamical system in each time step can be updated by analytical expressions, similar to a KF.

Other embodiments realize that the parameters can be updated by a difference of the measurement to the state estimate of the measurement. One embodiment weights the difference of the measurement to the state estimate of the measurement with the uncertainty of the state estimate, to further account for that the knowledge of the state estimate is uncertain.

Yet other embodiments realize that in cases where the measurement contains information about the disturbance of the dynamical system, a system with noise dependence, the predicting the state of the dynamical model can be done using the measurement from the previous time step. It is also realized that predicting the state using the previous measurement leads to the update of the parameters can be retained, but still incorporates information about the noise dependence. For example, such a method is beneficial for automotive applications, where the steering input from the driver is the input to a model of the motion of the vehicle, affecting the velocity of the vehicle. The steering input is not exactly known, but is measured by a noisy sensor attached to the steering wheel of the vehicle. If inertial measurements are used, such as acceleration measurements, also the model of the measurement of the vehicle includes the steering input from the driver. Hence, information about the steering input is contained in the measurement model of the vehicle.

Consequently, one embodiment is based on the understanding that the sensors affecting the motion model of the system and the sensors affecting the measurement model of the system, often are affected by a time varying offset and uncertainty of the knowledge of the variation of the sensor measurements. Another embodiment is based on that the sensor can be modeled by a combination of a deterministic part and a stochastic part, where the stochastic part is modeled by a Gaussian distribution with unknown mean and variance. Various embodiments realize that the mean and the variance of the Gaussian distribution can be used to model the offset and the variation of the sensor measurements. Consequently, in one embodiment the sensor is calibrated by the determining the mean and the variance of the Gaussian disturbance.

Accordingly, one embodiment discloses an apparatus for controlling a system, including a memory to store a model of the system including a motion model of the system subject to process noise and a measurement model of the system subject to measurement noise, such that one or combination of the process noise and the measurement noise forms an uncertainty of the model of the system with unknown probabilistic parameters, wherein the uncertainty of the model of the system causes a state uncertainty of the system with unknown probabilistic parameters; a sensor to measure a signal to produce a sequence of measurements indicative of a state of the system; a processor to estimate, using at least one or combination of the motion model, the measurement model, and the measurements of the state of the system, a first Student-t distribution representing the uncertainties of the model and a second Student-t distribution representing the state uncertainty of the system, the estimation is performed iteratively until a termination condition is met; and fit a Gaussian distribution representing the state uncertainty into the second Student-t distribution; and a controller to determine a control input to the system using the model of the system with state uncertainty represented by the Gaussian distribution; and control the system according to the control input.

Another embodiment discloses a method for controlling a system, wherein the method uses a processor coupled with stored instructions implementing the method, wherein the instructions, when executed by the processor carry steps of the method, including retrieving a model of the system including a motion model of the system subject to process noise and a measurement model of the system subject to measurement noise, such that one or combination of the process noise and the measurement noise forms an uncertainty of the model of the system with unknown probabilistic parameters, wherein the uncertainty of the model of the system causes a state uncertainty of the system with unknown probabilistic parameters; receiving a sequence of measurements indicative of a state of the system; estimating, using at least one or combination of the motion model, the measurement model, and the measurements of the state of the system, a first Student-t distribution representing the uncertainties of the model and a second Student-t distribution representing the state uncertainty of the system, wherein the estimating is performed iteratively until a termination condition is met; fitting a Gaussian distribution representing the state uncertainty into the second Student-t distribution; determining a control input to the system using the model of the system with state uncertainty represented by the Gaussian distribution; and controlling the system according to the control input.

Yet another embodiment discloses a non-transitory computer readable storage medium embodied thereon a program executable by a processor for performing a method, the method includes retrieving a model of the system including a motion model of the system subject to process noise and a measurement model of the system subject to measurement noise, such that one or combination of the process noise and the measurement noise forms an uncertainty of the model of the system with unknown probabilistic parameters, wherein the uncertainty of the model of the system causes a state uncertainty of the system with unknown probabilistic parameters; receiving a sequence of measurements indicative of a state of the system; estimating, using at least one or combination of the motion model, the measurement model, and the measurements of the state of the system, a first Student-t distribution representing the uncertainties of the model and a second Student-t distribution representing the state uncertainty of the system, wherein the estimating is performed iteratively until a termination condition is met; fitting a Gaussian distribution representing the state uncertainty into the second Student-t distribution; determining a control input to the system using the model of the system with state uncertainty represented by the Gaussian distribution; and controlling the system according to the control input.

DETAILED DESCRIPTION

Typically, a model of a system includes two models (equations). The first model is a motion model of the system relating a state of the system to a previous state of the system and an input to the system. The model can, for example, be a motion model traveling on a road where the state of the system includes a velocity and a heading rate, and where the input to the system is the steering angle of the driver. The motion model typically includes noise or disturbance representing uncertainty of the motion model. For instance, the disturbance can represent an uncertainty in how a driver of the vehicle behaves. This uncertainty is referred herein as process noise. The second model is a measurement model relating available measurements of the system to the state of the system. For example, a measurement can be a accelerometer relating the acceleration measurement to the velocity of the vehicle. The measurement model also includes measurement noise and/or other uncertainties referred herein as measurement noise. For instance, an accelerometer has noise in the measurements due to various sources, for example, mechanical vibrations in the components of the accelerometer.

Example of the motion model is $x_{k+1}=A_k x_k$, wherein $w_k$ is the process noise and $x_k$ is the state. An example of the measurement model is $y_k=C_k x_k+e_k$, wherein $e_k$ is the measurement noise.

The uncertainties in the motion model and the measurements cause the knowledge of the state to have uncertainty as well, which in general is not the same noise as the process and/or the measurement noise.

Figure 1A:
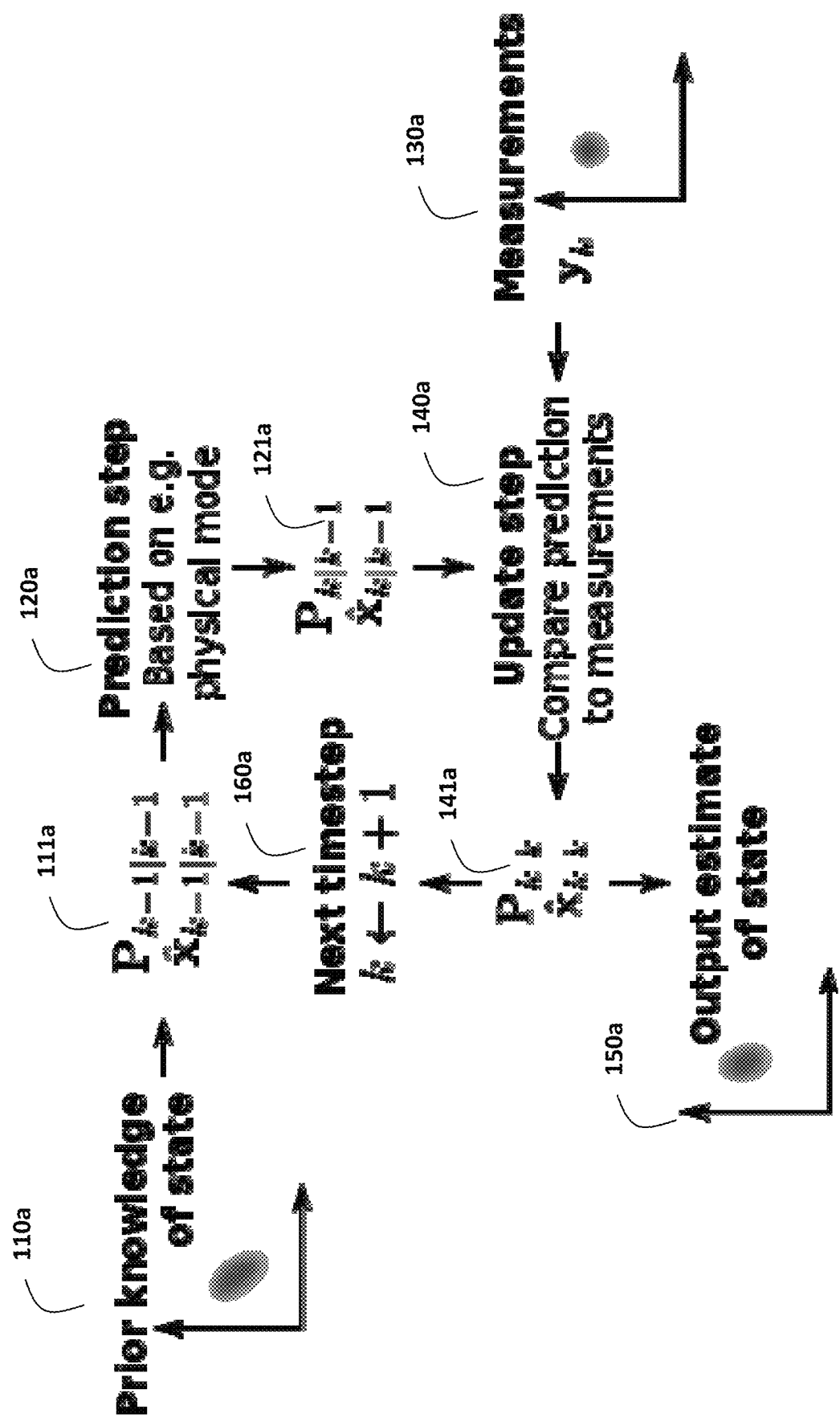
FIG. 1A is an illustration showing principles according to some embodiments.

FIG. 1A shows a schematic of the Kalman filter (KF) used by some embodiments. The KF is a tool for state estimation in linear state-space models, and it is the optimal estimator when the noise sources are known and Gaussian, in which case also the state estimate is Gaussian distributed. The KF estimates the mean and variance of the Gaussian distribution, because the mean and the variance are the two required quantities, sufficient statistics, to describe the Gaussian distribution.

Figure 1B:
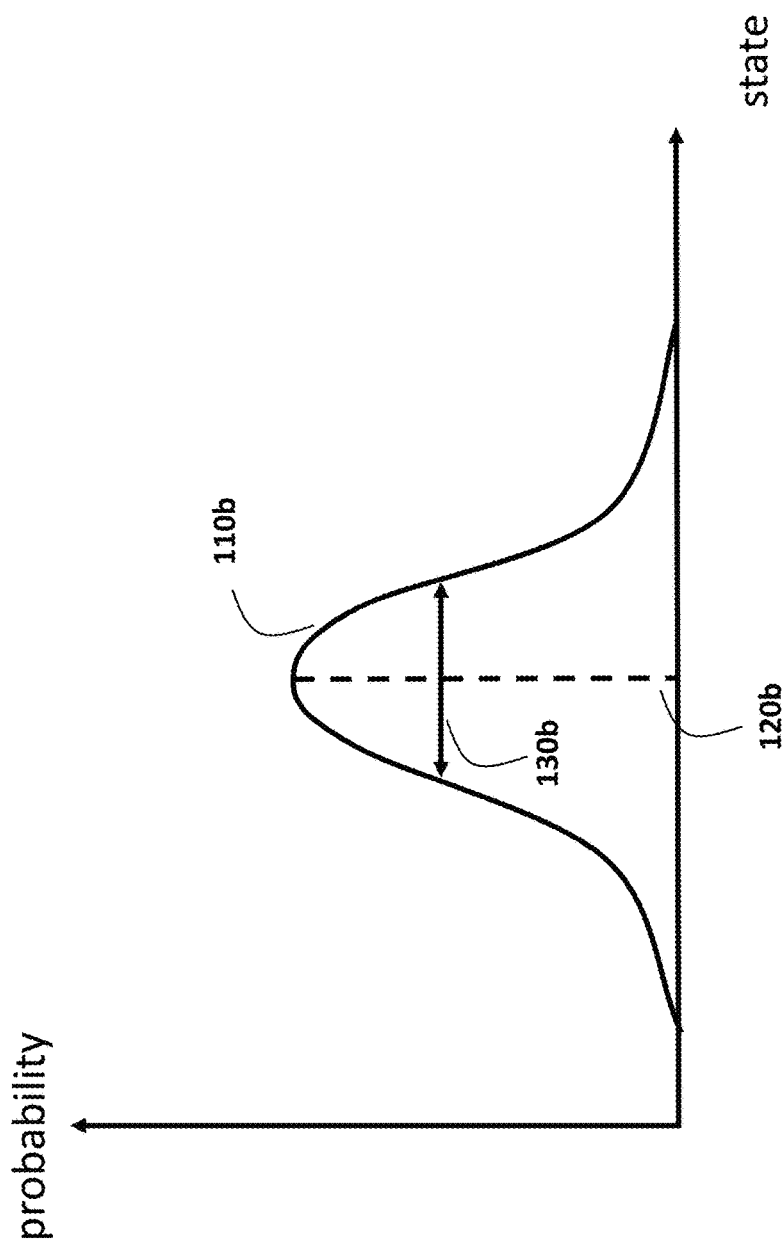
FIG. 1B is an illustration of a Gaussian distribution.

FIG. 1B shows a sketch of the Gaussian distribution 110b used by some embodiments in using the KF of FIG. 1A. The Gaussian distribution 110b is centered at the mean 120b of the distribution, and the variance 130b measures the spread, width, of the distribution. Referring back to FIG. 1A, the KF starts with an initial knowledge 110a of the state, to determine a mean of the state and its variance 111a. The KF then predicts 120a the state and the variance to the next time step, using a model of the system, to obtain an updated mean and variance 121a of the state. The KF then uses a measurement 130a in an update step 140a using the measurement model of the system, to determine an updated mean and variance 141a of the state. An output 150a is then obtained, and the procedure is repeated for the net time step 160a.

Figure 1C:
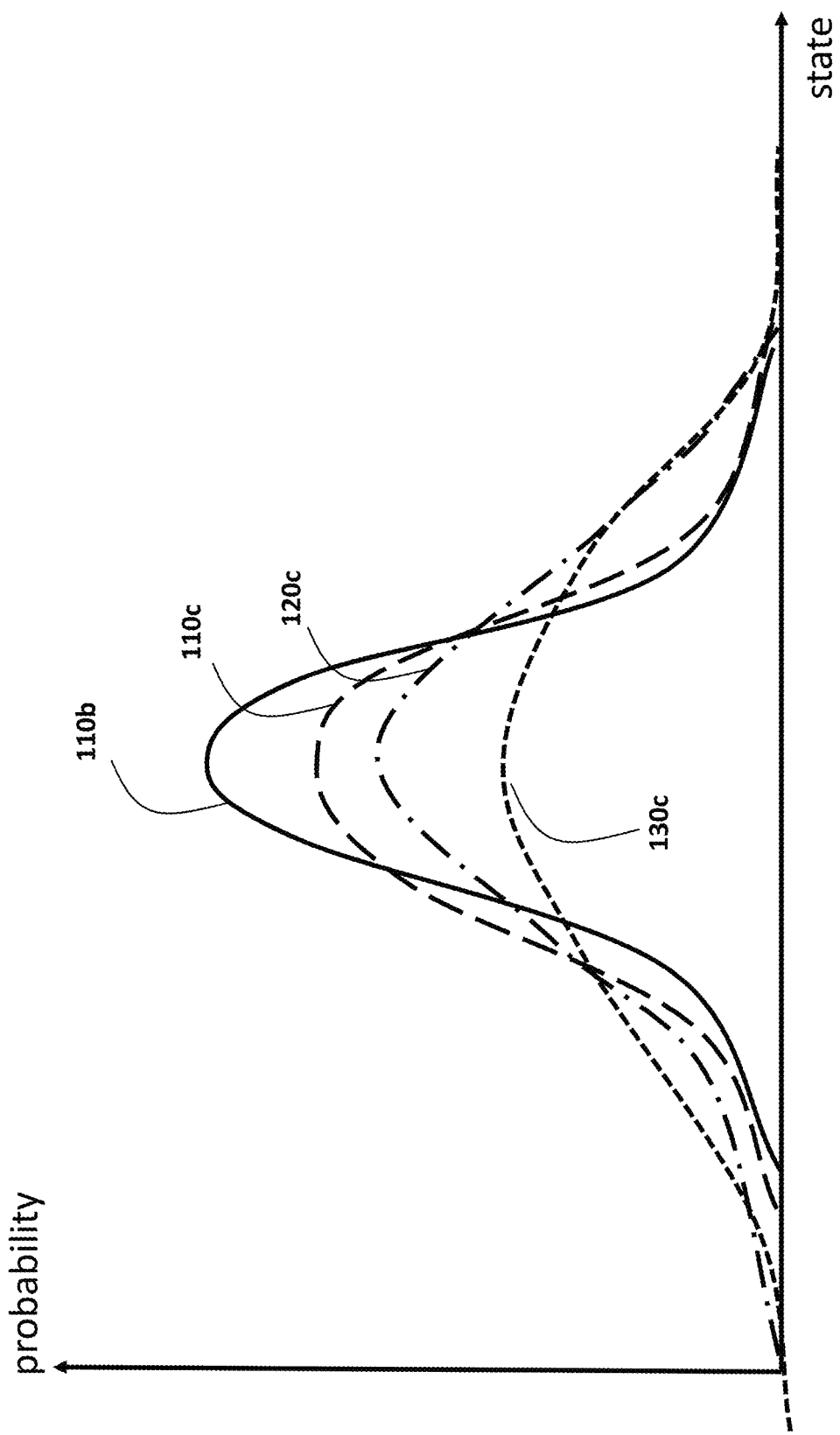
FIG. 1C is an illustration of how the Student-t distribution varies for different degrees of freedom.

FIG. 1C shows a graph illustrating the difference between the Gaussian distribution and the Student-t distribution for varying degrees of freedom in the Student-t distribution. The mean 120b and variance 130b of the Gaussian distribution is enough to describe the shape. The Student-t distribution needs three parameters, the mean, the scale, and the degree of freedom. The scale is the variance scaled with a function that is dependent on the degree of freedom. For instance, FIG. 1C shows three Student-t shapes, with three different degrees of freedom. For small number of the degree of freedom, the Student-t distribution 130c is a smoothed out version of the Gaussian. However, as the number of the degree of freedom increases, the Student-t becomes more similar, 120c and 110c, to the Gaussian distribution.

Both the state of the system and the state uncertainties are useful for a number of control applications. For example, the state of the system can be used to determine a control input to the system to accomplish a control objective, while the state uncertainty can be used to adjust the control input to ensure the feasibility of the control.

When the distributions of the process noise and the measurement noise are Gaussian, and the mean and the variance of the Gaussian distribution for the process and measurement noise are known, the KF can be used to estimate both the state of the system and the state uncertainty. However, when the variance of the Gaussian distribution for at least one of the process and measurement noise is unknown, the KF is not applicable. To that end, it is beneficial for a number of control applications to know probabilistic parameters of the distributions of the process noise and the measurement noise. For example, for Gaussian noise the probabilistic parameters include the mean and the variance of the Gaussian distribution that the noise arises from.

Some embodiments are based on recognition that when the probabilistic parameters of a distribution are unknown, it is reasonable to assume that the distribution is a Gaussian distribution. For example, this assumption is justified by the law of large numbers. For instance, an accelerometer has high-frequency noise components that when measured at a fixed sampling-rate resembles a Gaussian probability distribution.

Some embodiments are based on another recognition that it is possible to estimate unknown probabilistic parameters of the Gaussian distribution, such as mean and variance. For example, due to symmetry of the Gaussian distribution, the variance of the Gaussian distribution can be estimated using an average of variations of the data samples. However, some embodiments are based on realization that when the variance of the Gaussian distribution of the process noise and/or measurement noise is unknown, the distribution of the process noise and/or the measurement noise should be Student-t distribution, even when the actual distribution of the process noise and/or the measurement noise is Gaussian. This is because, the Student-t distribution can better capture the uncertainty of the unknown variance of the Gaussian distribution.

Figure 1D:
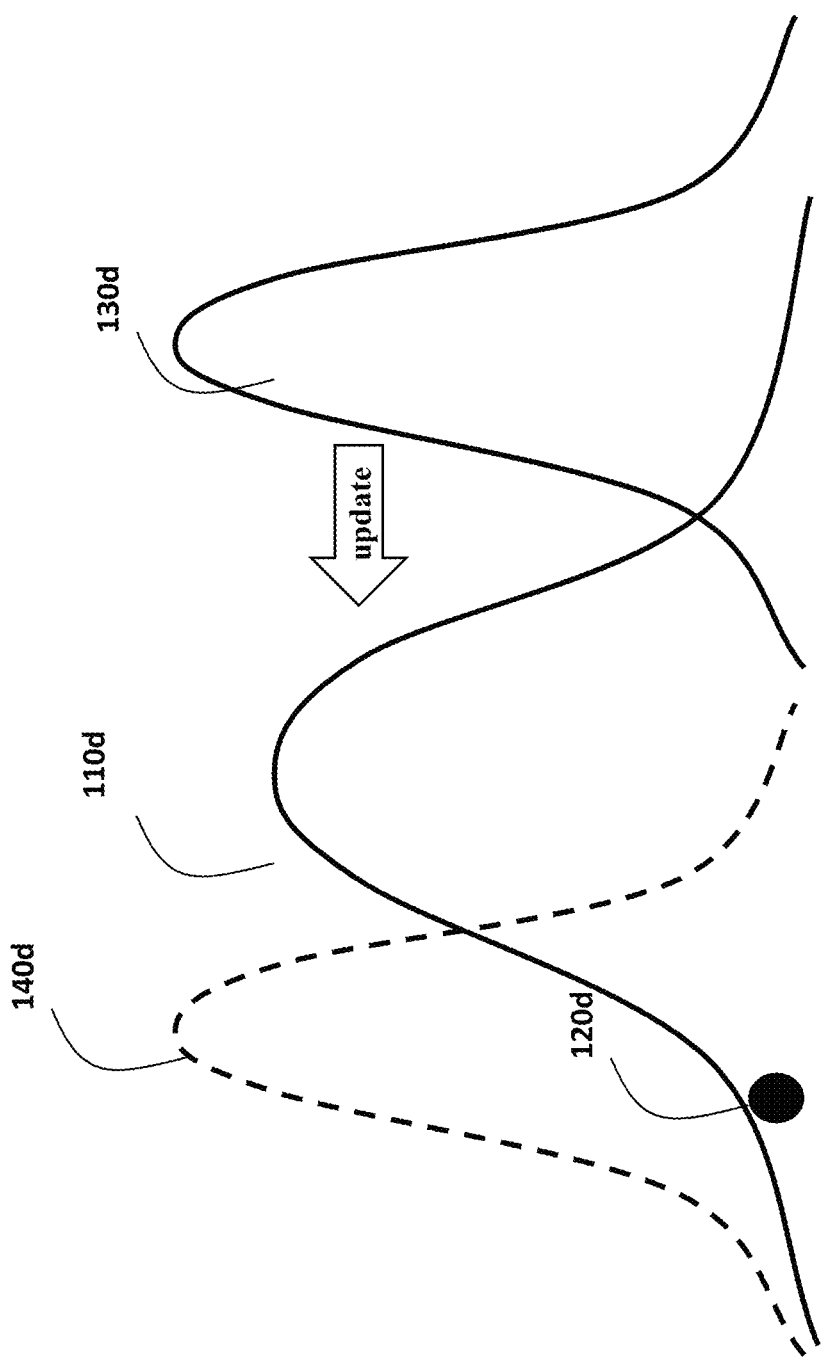
FIG. 1D is an illustration of how the Gaussian distribution is not well suited to handle uncertainties in probabilistic parameters according to some embodiments.

FIG. 1D shows a Gaussian distribution 110d and a measurement 120d, where the probabilistic parameters of the Gaussian distribution 110d are unknown, and where the measurement 120d originates from 110d. The measurement 120d is not close to the center of 110d, but has a nonnegligible probability of occurring. However, the measurement 120d is modeled to have originated from the Gaussian distribution 130d, for which the measurement has a close to zero probability with the current estimates of probabilistic parameters of 130d, and the result will be that the state estimator will move the state estimate and the distribution 140d associated with 120d in the wrong way.

Figure 1E:
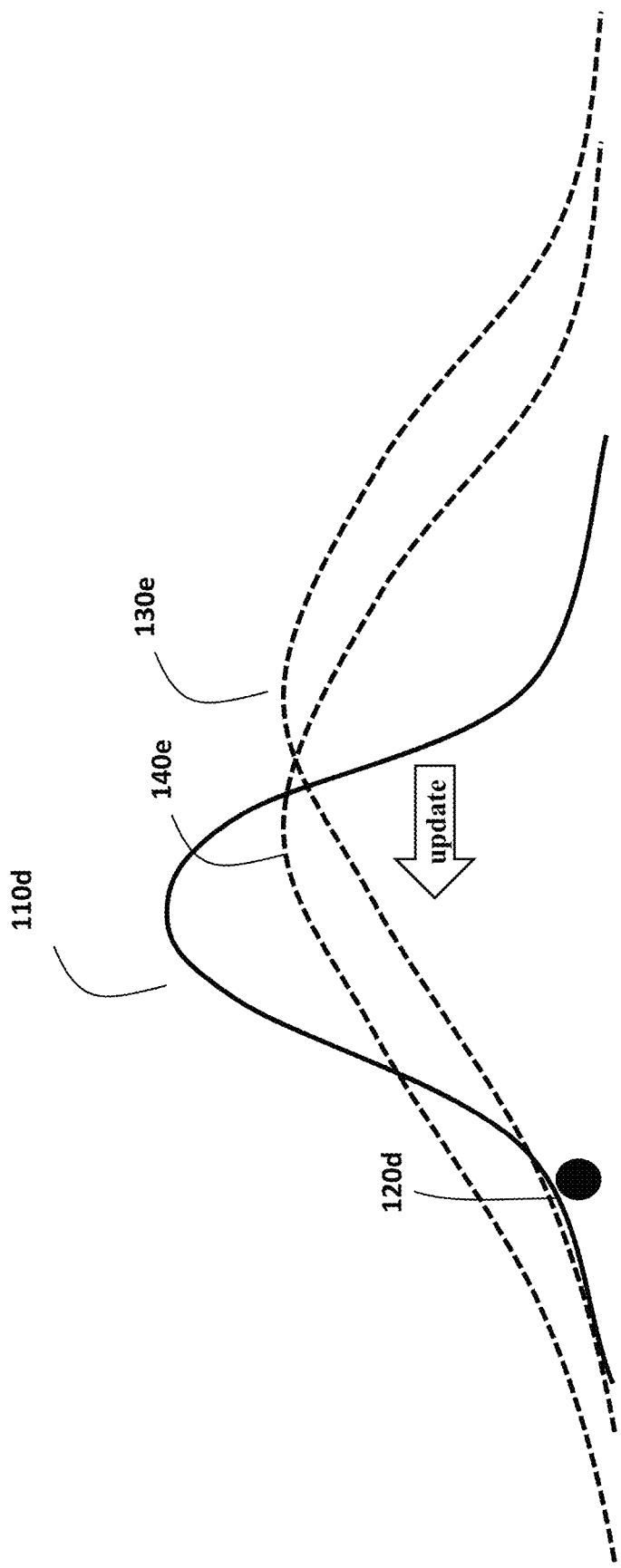
FIG. 1E is an illustration of how the Student-t distribution is suited to handle uncertainties in probabilistic parameters according to some embodiments.

FIG. 1E shows a Gaussian distribution 110d and a measurement 120d, where the probabilistic parameters of the Gaussian distribution 110d are unknown, and where the measurement 120d originates from 110d. The measurement 120d is not close to the center of 110d, but has a nonnegligible probability of occurring. However, the measurement 120d is in the estimator modeled to have originated from the Student-t distribution 130e, for which the measurement has a nonzero probability since the tails of the Student-t 130e covers the measurement 120d, and the result is that the state estimator moves the state estimate and the distribution 140e in a better way.

Unfortunately, however, the Student-t distribution is ill-suited for a number of control methods. That is, if the state of the system is represented with the Student-t distribution, a number of the assumptions when devising the control methods would be violated. For instance, many control systems, such as Linear Quadratic Gaussian controllers (LQG), rely on a Gaussian assumption of the process and measurement noise to provide stability guarantees.

To that end, some embodiments perform several transformations between the Gaussian and Student-t distributions to capture both the Gaussian nature of the process and the uncertainty of the Gaussian nature. Such a transformation allows to consider the uncertainty of Gaussian distribution in various control methods that are not designed to consider Student-t distributions.

For example, one embodiment determines initial estimates of the mean and the variance of the Gaussian noise, and thereby fits the parameters of a Student-t distribution to the Gaussian distribution. Another embodiment iteratively estimates the parameters of a Student-t distribution, namely the mean, the scale, and the degree of freedom, and fits a Gaussian distribution to the Student-t distribution. Doing in such a manner results in consistency with the Gaussian noise assumption but still accounts for the uncertainties in the mean and the variance of the Gaussian distribution.

Figure 2A:
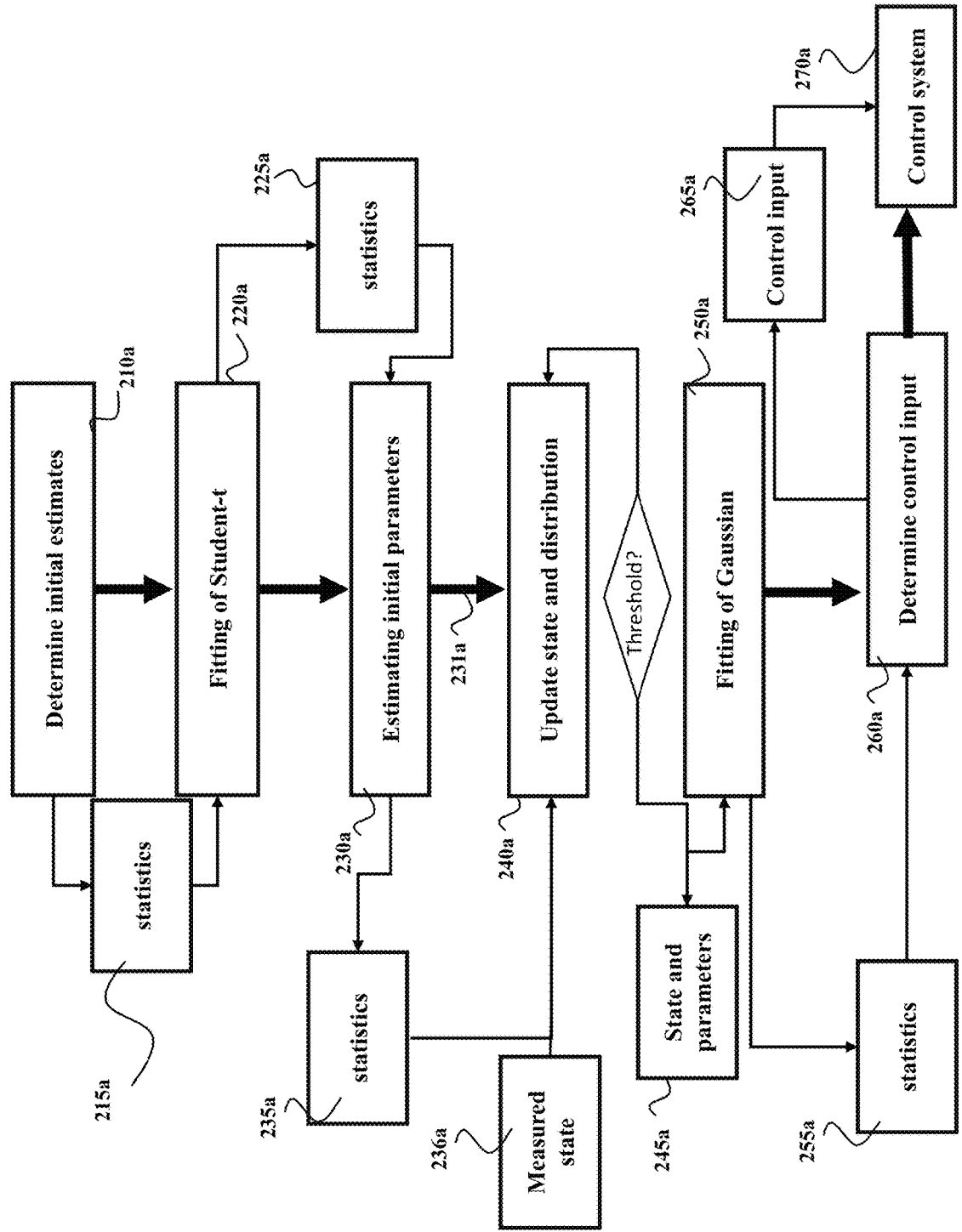
FIG. 2A is a flowchart of a method for jointly estimating a state of a system and probabilistic parameters of the system according to one embodiment of the invention, and to control the system.

FIG. 2A shows a flowchart of a method for controlling a system according to a model of the system including a motion model of the system subject to process noise and a measurement model of the system subject to measurement noise, such that one or combination of the process noise and the measurement noise forms an uncertainty of the model of the system with unknown probabilistic parameters, wherein the uncertainty of the model of the system causes a state uncertainty of the system with unknown probabilistic parameters. For instance, the unknown probabilistic parameters can be the mean and the variance of the Gaussian distribution. For instance, a parameter, such as a mass, of the system can be modeled as a Gaussian disturbance with a statistical mean and variance.

To that end, the method determines initial estimates 210a of the mean and the variance of a first Gaussian distribution representing the uncertainty of the model, to produce a mean and a variance 215a of a first Gaussian distribution. Then, the method uses the mean and variance 215a to fit a first Student-t distribution to the Gaussian distribution having the initial values of the mean and the variance to determine initial values of the mean, the scale, and the degree of freedom of the first Student-t distribution representing the uncertainties of the model. In one embodiment, the mean of the Student-t is the same as the mean of the Gaussian. In another embodiment, the scale is obtained by matching the moments of the Gaussian to the Student-t. In another embodiment, the fitting is done by moment matching and/or optimizing a cost function measuring the differences between the distributions.

Then, the method uses the initial estimates 225a of the first Student-t distribution, to determine 230a initial values of the mean, the scale, and the degree of freedom 235a of a second Student-t distribution representing the state uncertainty. In one embodiment, the determining is made by propagating the parameter of the first Student-t through the motion model of the system.

Using a measurement 236a the method then performs an iterative update 240a until a termination condition is met, a state of the system, the parameters of the first Student-t distribution, and the parameters of the second Student-t distribution 245a, wherein the updated parameters 245a yield also updated first and second Student-t distributions.

When the termination condition is met, the method fits 250a a Gaussian distribution representing the state uncertainty into the second Student-t distribution to produce the mean and the variance 255a of the second Gaussian distribution. Then, the method determines 260a, using the mean and the variance 255a of the second Gaussian distribution, a control input 265a and controls 270a the system according to the control input 265a.

In some embodiments, the initial values of the second Student-t distribution equal the initial values of the first Student-t distribution. Choosing such initial values can be advantageous when there is no or little reason to believe that the initial uncertainty of the state will change from the initial uncertainty of the model itself. However, in one embodiment the initial values differ. For instance, one embodiment determines the initial values of the second Student-t distribution to be a function of the model of the system and the initial values of the first Student-t distribution. This can be valuable, for example, when the initial values of the first Student-t distribution have been determined in advance, and there is reason to believe that the state of the system has changed since the initial values of the first Student distribution were determined. In another embodiment, the initial values of the second Student-t distribution equal the initial values of the first Student-t distribution, but the final values of the second Student-t distribution differ from the final values of the first Student-t distribution. This is in general the case unless the motion model of the system and the measurement model of the system are modeled in such a way that the respective changed introduced by the two models cancel out.

Figure 2B:
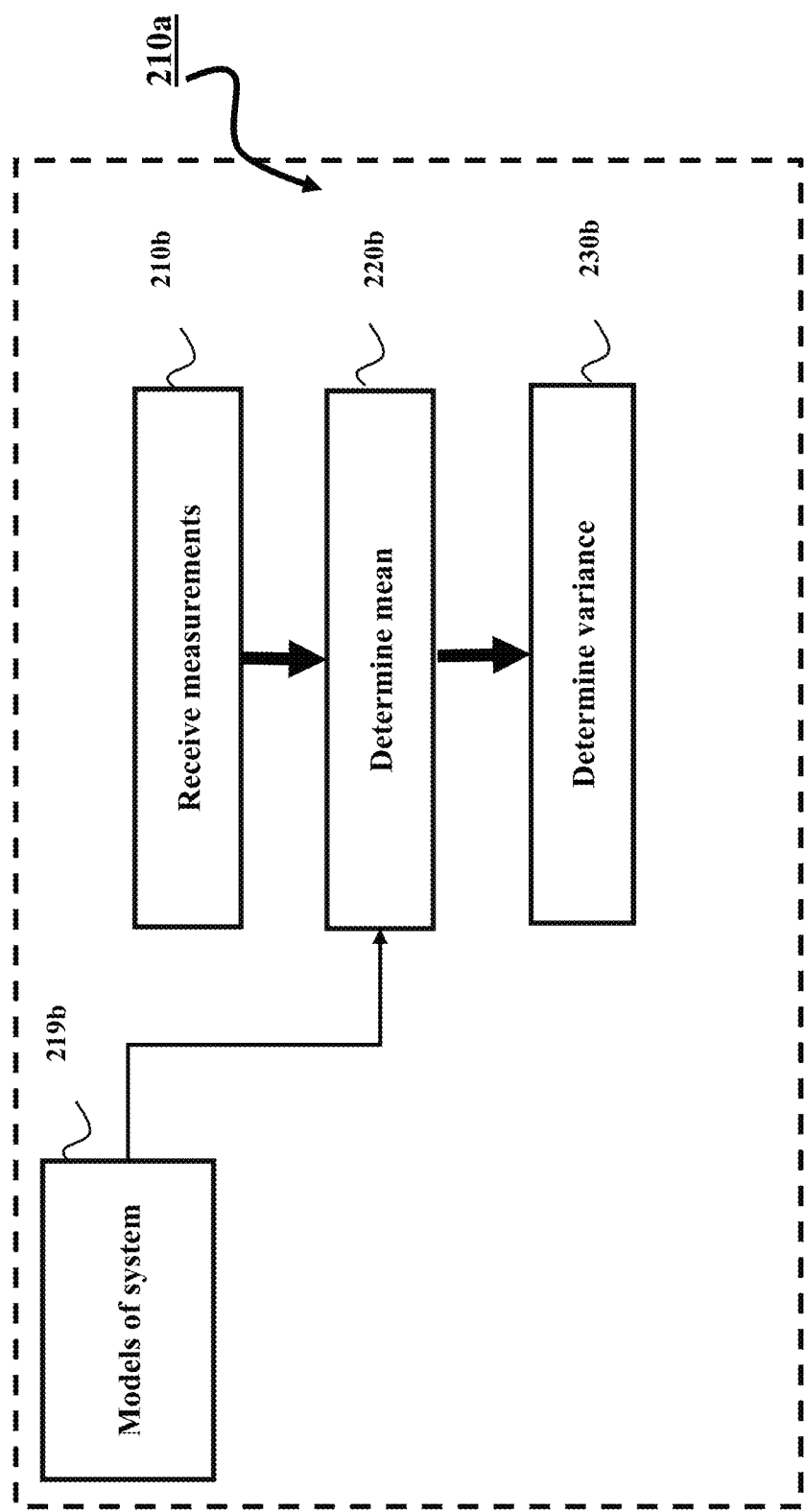
FIG. 2B is a flowchart of an exemplar implementation of determining initial estimates according to one embodiment.

FIG. 2B shows a flowchart of an exemplar implementation of 210a according to various embodiments. First, the method 210a obtains 210b, either through collecting data or by receiving data from a memory, historical measurements of the system. Then, using a model 219b of the system, the method determines 220b an average value of historical measurements to produce an initial estimate of the mean according to the model of the system relating the state to the historical measurements. The method then determines 230b the initial estimate of the variance using an average variation of historical measurements and the model relating the state to the measurements.

Figure 2C:
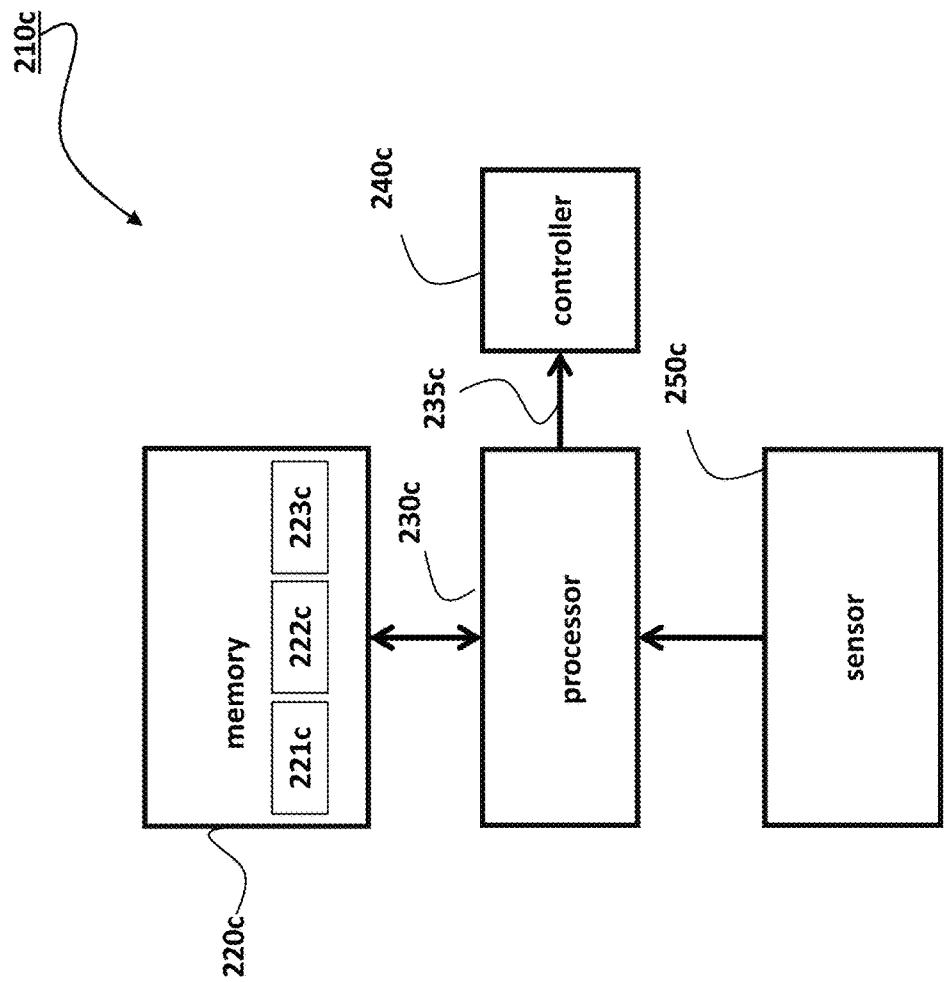
FIG. 2C is a block diagram of an apparatus for controlling a system according to some embodiments.

FIG. 2C shows a block diagram of an apparatus 210c for controlling a system according to some embodiments. The apparatus includes a memory 220c to store a model of the system including a motion model 221c of the system subject to process noise and a measurement model 222c of the system subject to measurement noise, such that one or combination of the process noise and the measurement noise forms an uncertainty of the model of the system with unknown probabilistic parameters. The uncertainty of the model of the system causes a state uncertainty 223c of the system with unknown probabilistic parameters.

The apparatus 210c also includes a sensor 250c to measure a signal to produce a sequence of measurements indicative of a state of the system, a processor 230c to estimate a Gaussian distribution 235c representing the state uncertainty, and a controller 240c to determine a control input to the system using the model of the system with state uncertainty represented by the Gaussian distribution 235c and control the system according to the control input. The controller 240c controls the system using various control methods, such as model predictive control, which uses a model of the system, often using an underlying Gaussian noise assumption, to make predictions of the system due to different control commands. Another possible control method is LQG control, which also relies on an underlying Gaussian assumption. It is to be understood that embodiments are not limited to these methods.

The processor 230c determines the Gaussian distribution 235c based on a first Student-t distribution representing the uncertainties of the model and a second Student-t distribution representing the state uncertainty of the system. For example, the processor estimates the first and/or the second Student-t distributions using at least one or combination of the motion model, the measurement model, and the measurements of the state of the system. In some embodiments, the estimation is performed iteratively until a termination condition is met. Examples of termination conditions include the that available computation time limit has been met, that a predefined number of iterations have been reached, and that the difference between two consecutive updates are below a predefined threshold. Upon meeting the termination condition, the processor fits a Gaussian distribution representing the state uncertainty into the second Student-t distribution.

In such a manner, some embodiments perform several transformations between the Gaussian and Student-t distributions to capture both the Gaussian nature of the process and the uncertainty of the Gaussian nature. Such a transformation allows to consider the uncertainty of Gaussian distribution in various control methods that are not designed to consider Student-t distributions.

In some embodiments, the initial value of the degree of freedom is selected as a positive finite integer value greater than the dimension of the state dimension. In other embodiments, the degree of freedom is greater than the sum of the state dimension and the measurement dimension. In another embodiment, the determined initial value of the degree of freedom is used to determine the mean and scale of the first Student-t distribution. For instance, the embodiment determines the initial scale as the initial variance of the first Gaussian distribution divided by an affine function of the initial degree of freedom.

Referring back to FIG. 1C, the value of the degree of freedom characterizes the tails of the Student-t distribution, and therefore the sensitivity to uncertainties in the parameters of the Gaussian disturbance. Some embodiments are based on the understanding that the disturbance acting on the model of the system are due to several factors. For instance, both parameters of the model itself and inputs to the system can be uncertain. In such a setting, the disturbance model lumps together several disturbances.

Consequently, one embodiment estimates the level of uncertainties of the model and selects an initial value of the degree of freedom as a function of the level of uncertainties in the model.

As the degrees of freedom increase, the Student-t distribution approaches the Gaussian. One embodiment is based on the understanding that it can be beneficial to avoid this merging. Consequently, the embodiment restricts the parameters of the Student-t distribution such that the Student-t and Gaussian are sufficiently close to each other, but not exactly the same. For instance, one embodiment determines a finite degree of freedom after the termination threshold in the iterative update 240a is met.

The fitting of a Gaussian distribution to a Student-t distribution, and vice versa, can be done in several ways. One embodiment determines the fitting 250a of the second Gaussian distribution into the second Student-t distribution as one or a combination of a moment matching and a similarity optimization. For instance, one embodiment determines the fitting by matching the variance of the Gaussian to the scale of the Student-t, by dividing the scale with an affine function of the degree of freedom. In another embodiment, the fitting is done by optimizing a cost function measuring the differences between the distributions. The cost function can be chosen in several ways, including as the difference between the estimated Student-t distribution and the Gaussian distribution.

Figure 3A:
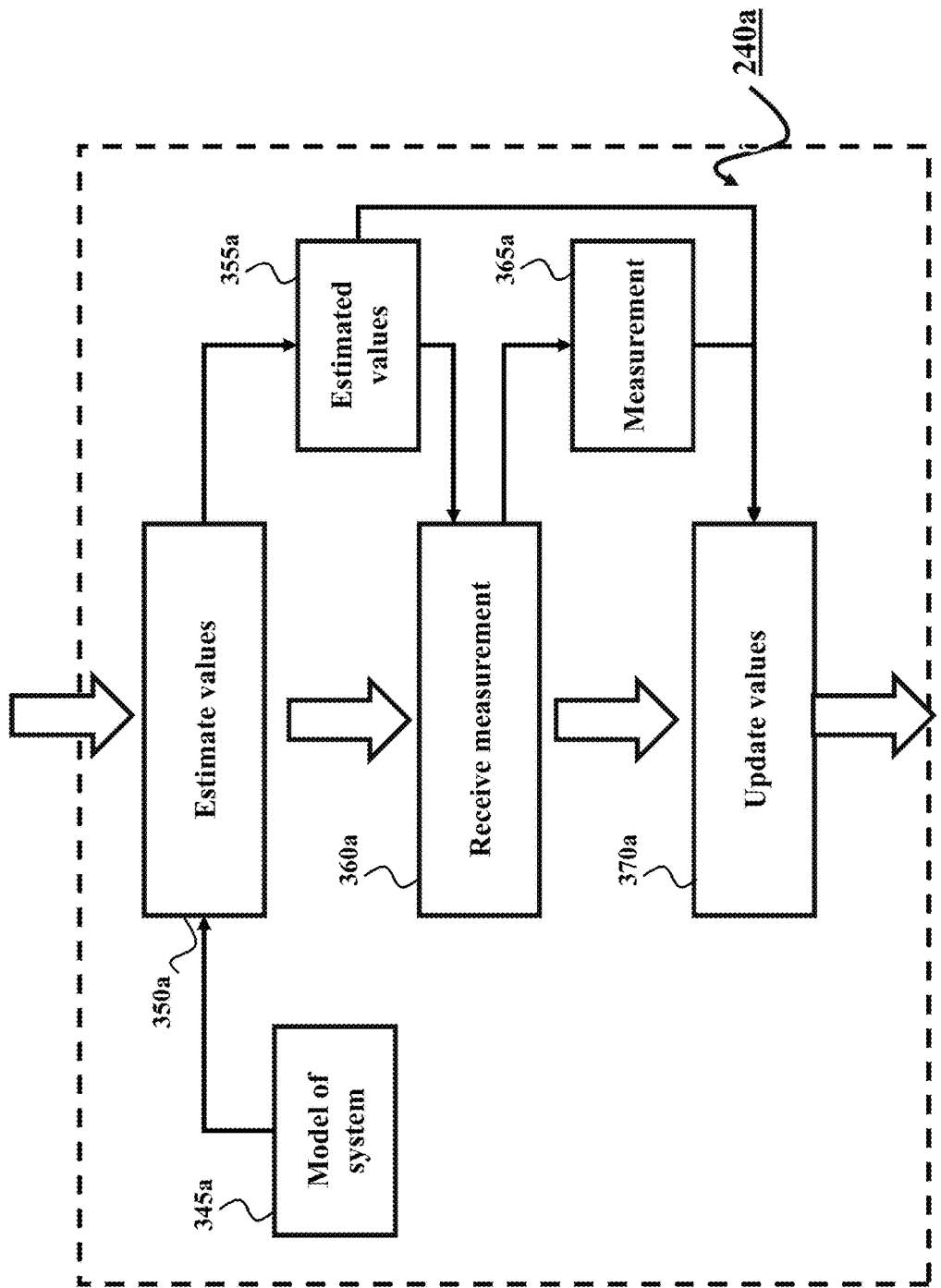
FIG. 3A shows a flowchart of one iteration of a method for updating the state of the system.

FIG. 3A shows a flowchart of one iteration of a method 240a for updating the state of the system, the parameters of the first Student-t distribution, and the parameters of the second Student-t distribution, according to embodiments of the invention. The method estimates 350a, using the motion model, the state of the system, current values of the first Student-t distribution, and current values of the second Student-t distribution based on a previous estimation of the state of the system, previous values of the first Student-t distribution, and previous values of the second Student-t distribution. Then, the method receives 360a a measurement of the system. Using the measurement 365a and the measurement model 345a, the method updates 370a the current estimation of the state of the system, the current values of the first Student-t distribution, and the current values of the second Student-t distribution, based on the estimated values 355a.

Sometimes the probabilistic parameters are time varying. For instance, in navigation systems where inertial sensing and/or GPS is used, the noise statistics often have temporal dependence that cannot be determined a priori. Other examples are changing noise statistics due to linearization errors in approximated nonlinear models, and another example is environment-dependent sensor statistics Accordingly, some embodiments are based on the understanding that the updating 240a, the fitting the second Gaussian distribution 250a, the determining the control input 260a, and the controlling 270a may be needed to be performed at different time steps. To this end, one embodiment iterates the updating 240a, the fitting the second Gaussian distribution 250a, the determining the control input 260a, and the controlling 270a for different control steps. Doing in such a manner allows for determining time varying probabilistic parameters.

In some embodiments, the state of the system evolves dynamically in time according to a model of the motion of the state of the system. If choosing the model of the motion of the system and the model of the inputs to the system carefully, the motion of the state of the system can be described as one part that is independent on the probabilistic parameters, which is entirely determined by the state of the vehicle, and one uncertain part, where the uncertain part is dependent on the noise to the system. In some embodiments, the system relating the state at a future time step with a state of the current time step is written as $x_{k+1}=A_k x_k + w_k$, wherein $w_k$ is the process noise and $x_k$ is the state. An example of the measurement model is $y_k = C_k x_k + e_k$, wherein $e_k$ is the measurement noise. In one embodiment, the model is instead written as $x_{k+1} = A x_k + u_k + w_k$, where $u_k$ is the deterministic input to the system, and/or similar for the measurement model. The state can describe physical states such as position or velocity, or nonphysical state. The model can be obtained from physical modeling, such as force and mass balances, or can be obtained from system identification and black box models. In another embodiment, the original system model is $x_{k+1} = f(x_k, u_k) + g(x_k, u_k) w_k$, which is nonlinear, and similar for the measurements. However, the nonlinear model can be transformed to a linear system, either through a mathematical linearization of the dynamics, or by other techniques, such as statistical linearization techniques.

In some embodiments, the state and probabilistic parameters are obtained by probabilistic methods. In terms of a probability density function (PDF), with the definition $\theta_k := \{\mu_k, \Sigma_k\}$ where the parameters are the mean and the variance of the first Gaussian distribution, the dynamical system can be described as $p(x_{k+1} | x_k, u_k, \theta_k)$. Some embodiments rely on the realization that determining the state of the system and the probabilistic parameters can be done by determining the PDF of the total system, given measurements and model of the motion and model of the measurements. For instance, in case of known mean and unknown variance, to determine the PDF, some embodiments determine the PDF as the product of a PDF of the state and the PDF of the parameters as $$p(x_k, \theta_k | y_{0:k}) \approx St(x_k | \hat{x}_{k|k}, P_{k|k}, v'_k) \cdot iW(\theta_k | \Lambda_k, v_k),$$

where St is the Student-t distribution and iW is the inverse-Wishart distribution.

Some embodiments are based on the understanding that the state of the dynamical system in each time step can be updated by analytical expressions, similar to a KF.

Other embodiments realize that the parameters can be updated by a difference of the measurement to the state estimate of the measurement. One embodiment weights the difference of the measurement to the state estimate of the measurement with the uncertainty of the state estimate, to further account for that the knowledge of the state estimate is uncertain.

For instance, one embodiment determines the estimating using the $$\hat{x}_{k+1|k} = A\hat{x}_{k|k},$$

motion model as, $P_{k+1|k} = AP_{k|k}A^T + \Sigma_{w_k,k}$, where $\Sigma_{w_k,k}$ is the estimated scale of the process noise of the first Student-t distribution and is the estimated scale of the second Student-t distribution. When there is a dependency between the unknown process and measurement noise, one embodiment instead performs the estimating the motion model by accounting for the current measurement when estimating the next state.

In one embodiment, the updating the second student-t distribution using the measurement is done by a combination of a weighted difference of the estimated state and the difference between the measurement and the measurement model, where the weighting is determined by a combination of the scale of the second Student-t distribution and the estimated scale of the first Student-t distribution.

In another embodiment, the updating the first Student-t distribution is done by updating the mean as a combination of the estimated mean and a weighted difference of the estimated mean and the updated mean of the state. Alternatively, or additionally, the updating is done as the difference between the measurement and the estimated measurement based on the measurement model. Some embodiments update the scale by combination of a difference of the measurement to the state estimate of the measurement with the current estimated scale.

Other embodiments realize that the parameters can be updated by a difference of the measurement to the state estimate of the measurement. One embodiment weights the difference of the measurement to the state estimate of the measurement with the uncertainty of the state estimate, to further account for that the knowledge of the state estimate is uncertain.

In the updating the degree of freedom related to the second Student-t distribution, one embodiment updates the degree of freedom as the combination of the previous degree of freedom and a positive value, to increase the degree of freedom. In another embodiment, in the estimation of the degree of freedom, the degree of freedom is scaled with a value smaller than one, to ensure that the degree of freedom does not grow too fast. Doing in such a manner ensures that the Student-t does not converge to the Gaussian too fast.

In another embodiment, the updating the degree of freedom related to the first Student-t distribution, one embodiment updates the degree of freedom as the combination of the previous degree of freedom and a positive value, to increase the degree of freedom. In another embodiment, in the estimation of the degree of freedom, the degree of freedom is scaled with a value smaller than one, to ensure that the degree of freedom does not grow too fast. Doing in such a manner ensures that the Student-t does not converge to the Gaussian too fast.

In one embodiment, in the iterative updating the Student-t distributions, and in the updating the Student-t distributions for different control steps, the degrees of freedom are in each iteration or each control step chosen as the smallest of the degrees of freedom of the first and second Student-t distribution. Doing in such a manner ensures that the degree of freedom stays finite, which ensures that the method accounts for the uncertainty in the probabilistic parameters.

One embodiment is based on the understanding that the sensors affecting the motion model of the system and the sensors affecting the measurement model of the system, often are affected by a time varying offset and uncertainty of the knowledge of the variation of the sensor measurements. Another embodiment is based on that the sensor can be modeled by a combination of a deterministic part and a stochastic part, where the stochastic part is modeled by a Gaussian distribution with unknown mean and variance. Various embodiments realize that the mean and the variance of the Gaussian distribution can be used to model the offset and the variation of the sensor measurements. Consequently, in one embodiment the sensor is calibrated by the determining the mean and the variance of the Gaussian disturbance.

Some embodiments acknowledge that the probabilistic parameters can be accurately estimated, by considering the probabilistic parameters of the first Student-t distribution and the and state of the vehicle jointly, that is, the second Student-t distribution jointly. In one embodiment, the quantities are estimated by assigning probabilities to how likely the combination of the quantities is to explain the measurement vector.

Figure 4A:
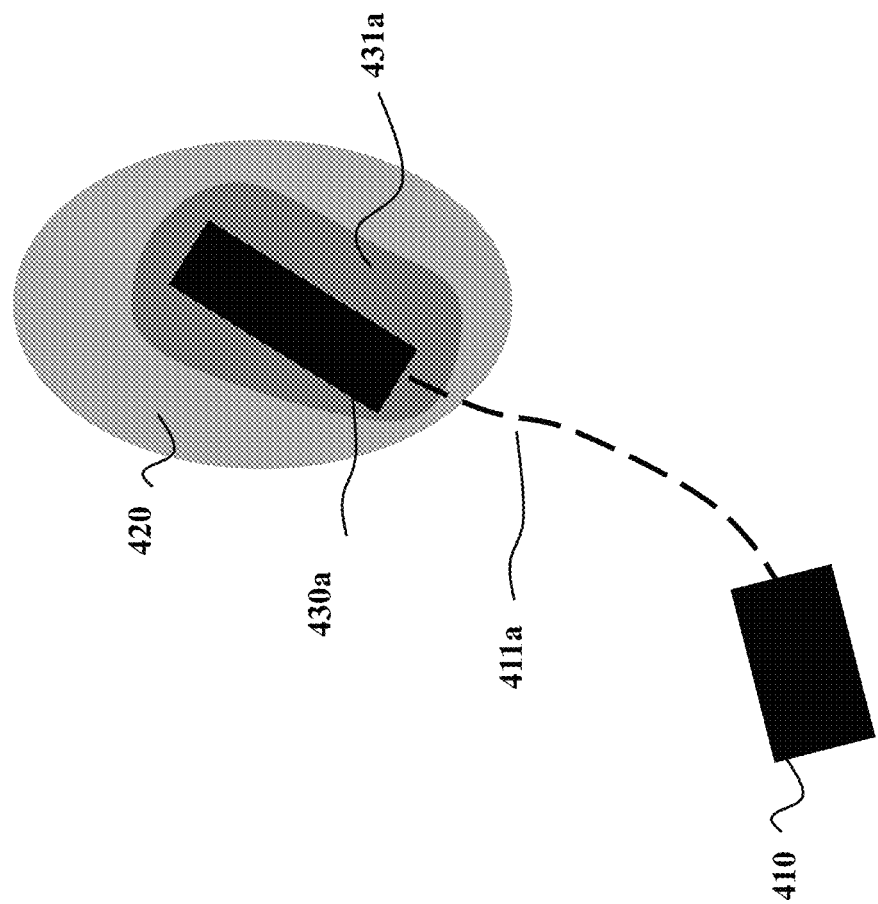
FIG. 4A is an illustration of determining probabilistic parameters and state of the system according to some embodiments of the invention.

For instance, FIG. 4A illustrates a scenario where a vehicle has an initial state 410. For one set of probabilistic parameters and an input to the system, the vehicle obeys the motion 411a and ends up in 430a, with resulting uncertainty 431a due to the uncertainty in the probabilistic parameters of the first Student-t affecting the vehicle motion. The variance of the uncertainties of the model leads to that the state of the vehicle can only be known up to a certain area 420. However, the end state of the vehicle 430a well resides within the area 420, so this particular combination of probabilistic parameters and initial state of the vehicle, is given a high probability of being a good combination.

Figure 4B:
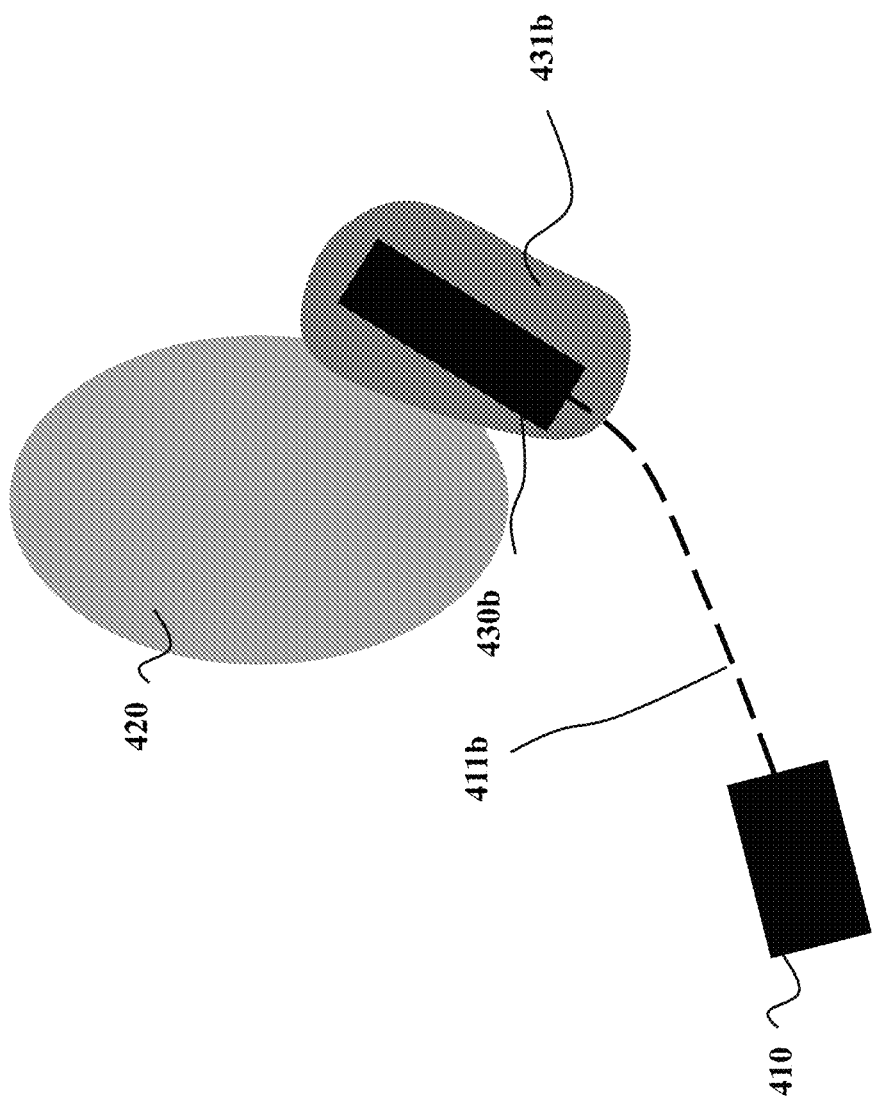
FIG. 4B is an illustration of determining probabilistic parameters and state of the system according to some embodiments of the invention.

FIG. 4B shows a vehicle with the same initial state 410 with another set of probabilistic parameters of the first Student-t distribution affecting the motion model. For the same inputs to the system, the vehicle 410 now obeys the motion 411b, leading to that the vehicle ends up in state 430b, with resulting uncertainty 431b of the second Student-t of the state. However, this end state 430b of the vehicle does not reside within the certainty area of the measurement noise affecting the measurement model. Thus, this particular combination of initial state and probabilistic parameters is assigned a low probability of being a good combination.

Figure 4C:
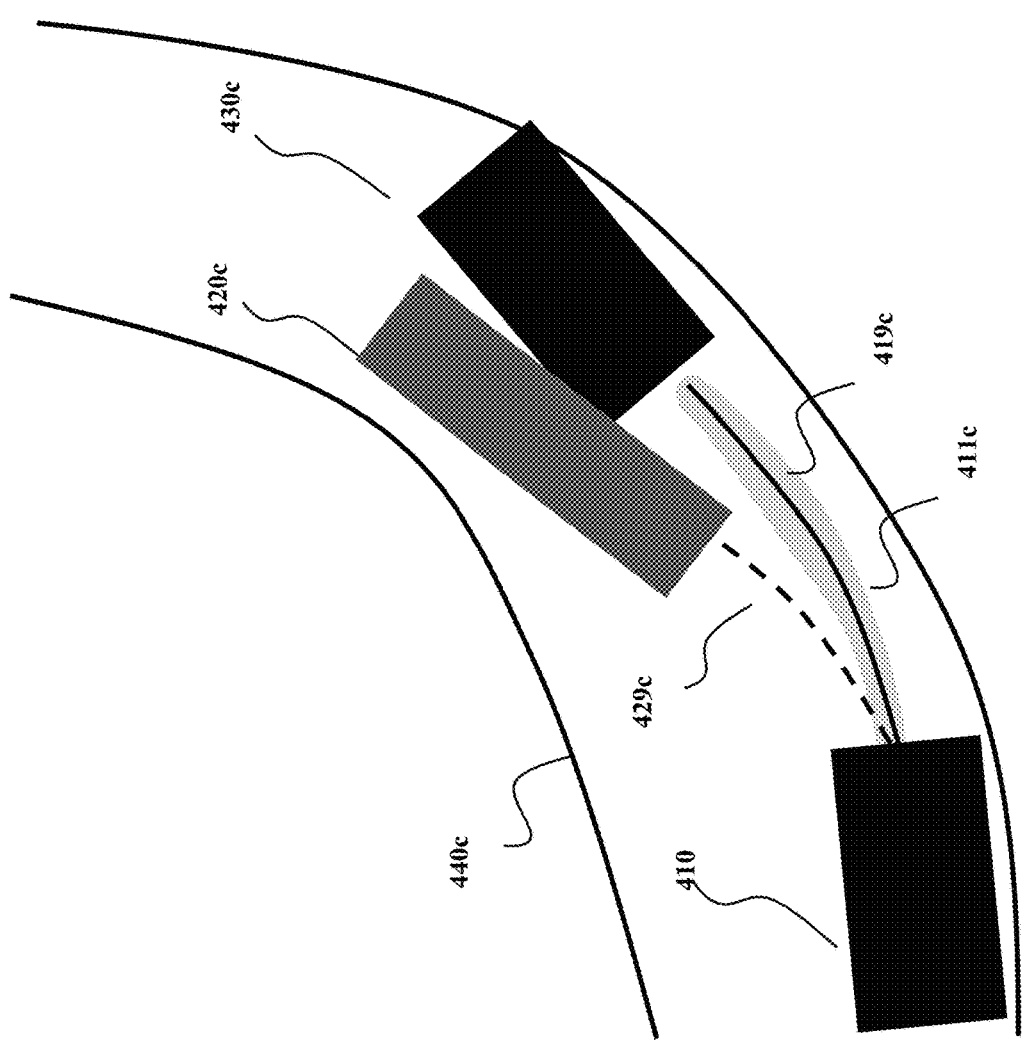
FIG. 4C is a schematic of different motions determined according to some principles employed by some embodiments of the invention.

FIG. 4C shows a schematic of different motions determined according to some principles employed by various embodiments of the invention. The vehicle is estimated to be at the current state 410 on a road with road boundaries 440c, where the estimates of the current state 410 has been determined during previous iterations according to other embodiments of the invention. The lines 419c and 429c are two different motions determined using two different set of probabilistic parameters affecting the motion model, leading to two possible states 420c and 430c of the vehicle. The gray area 411c indicates the estimate of the uncertainty of the measurement noise affecting the measurement model, that is, the possible area where the motion is likely to occur, determined from the estimated measurement noise affecting the measurement model determined during previous iterations. Only the motion 419c is inside the uncertainty region. Hence, the state 420c resulting from the motion 429c, and the probabilistic parameters associated with the motion 429c, are given a low probability of being a good combination.

Figure 4D:
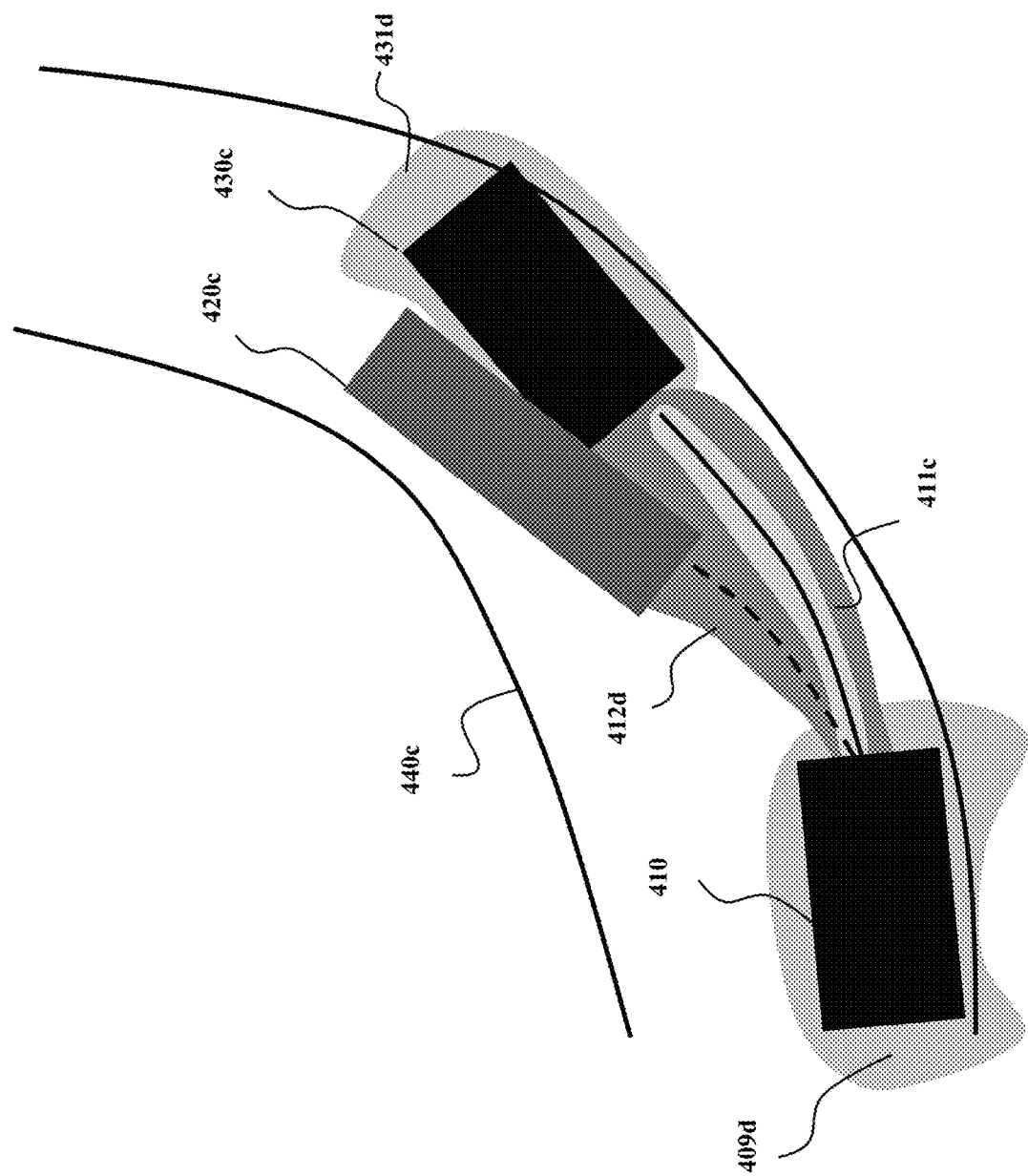
FIG. 4D is a schematic of different motions and associated probability distributions determined according to some principles employed by some embodiments of the invention.

As shown in FIG. 4D, the motion of the vehicle can be modeled in the form of a PDF 412d over the state of the vehicle, wherein the initial condition 409d of the PDF 412d has been determined during previous iterations by other embodiments of the invention. In some of the embodiments of the invention, the motion is computed by; first determining a distribution of motions from initial states to end states, where the different motions are initiated according to the probabilistic parameters of the first Student-t distribution affecting the motion model belonging to that particular motion; second, determining how the different motions according to the distribution of the first Student-t agree with the motion as measured by a sensor modeled in the measurement model; third, determining parameters that are consistent with the determining how the different motions agree with the true motion sensed by the sensing system. To illustrate, FIG. 4D shows a situation where two different parameters of the process noise lead up to states 420c and 430c, respectively, and the PDF 412d of the motion of the vehicle both agree with the respective motions. However, after determining how the different motions agree with the PDF 411c of the measurements, where the PDF 411c is dependent on the measurement noise affecting the measurement model, the PDF 431d is achieved, which does not agree with the state 420c. In some embodiments, the PDF 431d is determined by a combination of the estimates at a previous iteration and the measurement from the sensor. In certain embodiments of the invention, the resulting PDF 431d forms the basis for another iteration of the method.

Some embodiments are based on the understanding that measurements using sensors not always affect the measurement model of a system, but additionally or alternatively the sensor measurements also affect the motion model of a system. For example, such an understanding can be important in automotive applications, where the steering input from the driver or a controller of the vehicle is the input to a model of the motion of the vehicle, affecting the velocity of the vehicle. The steering input is not exactly known, but is measured by a noisy sensor attached to the steering wheel of the vehicle. If inertial measurements are used, such as acceleration measurements, also the model of the measurement of the vehicle includes the steering input from the driver. Hence, information about the steering input is contained in the measurement model of the vehicle. Furthermore, due to the construction of the sensor or misalignment in the sensor, sensors are often prone to time varying offsets and measurement variations. In addition, while some sensor calibration can be performed beforehand, for example when mounted in a vehicle, some sensors, such as an accelerometer, can have an effective noise level that differs from the a priori determined. The reason is that the sensor noise is dependent on a number of factors such as temperature, age, and where in the vehicle the sensor is placed. For instance, the higher the sensor is placed, the more of the disturbances from the suspension system affect the apparent noise in the sensor.

Figure 5A:
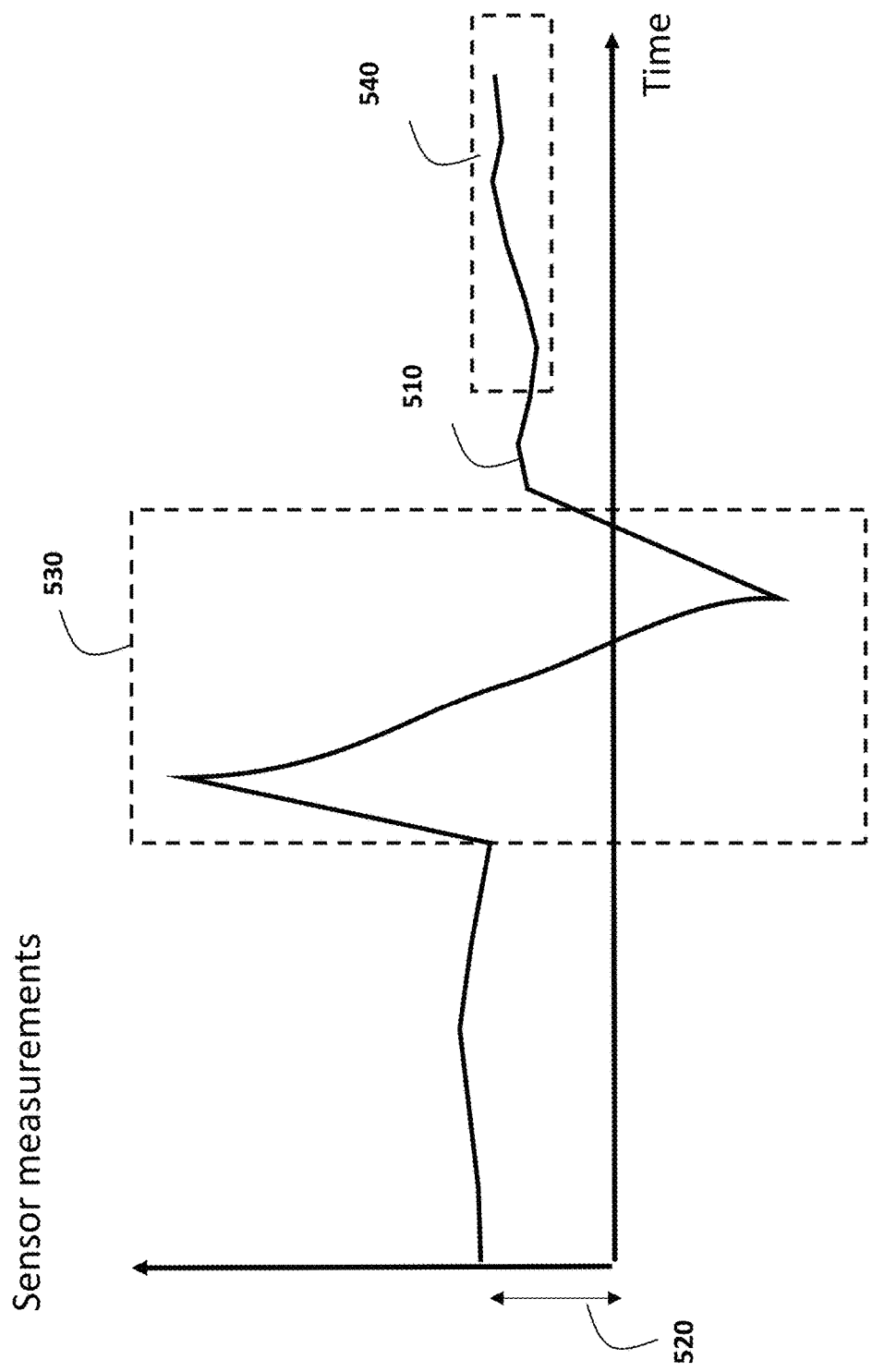
FIG. 5A is an illustration of how the sensor measurements of a sensor typically varies with time.

FIG. 5A shows an illustration of how the measurements 510 of a sensor of a system typically varies with time depending on the state of sensor. As used herein, the state of sensor includes at least one parameter indicative of the sensor readings of the motion of the system. Examples of the parameter of state of sensor includes one or a combination of a calibration error, an offset, a temperature dependence, a white noise intensity, a random walk bias, a scale error, a gain error, and a variance. The model of the time variation of the state of sensor is generally unknown and depends on both intrinsic and extrinsic factors, and the various parameters defining the state of sensors can depend on each other. For instance, the state of sensor of a gyroscope sensor measuring the rotation rate of a vehicle depends on a number of factors, such as the temperature of the environment, the temperature of the sensor components itself, the alignment of the sensor with the vehicle, scale errors, or periodic behavior in the circuits of the sensor. As used herein, a vehicle can be any type of wheeled vehicle, such as a passenger car, bus, or rover. As used herein, a sensor can be any type of sensing device measuring an entity related to the motion of the vehicle. For instance, a sensor can be an accelerometer, a gyroscope, a global positioning system receiver, a sensor measuring the wheel angle, or a wheel encoder. Often, the sensor readings 510 consist of a constant part 520, a slowly time varying part 540, and a part 530 that varies in relation to the motion of the vehicle.

Figure 5B:
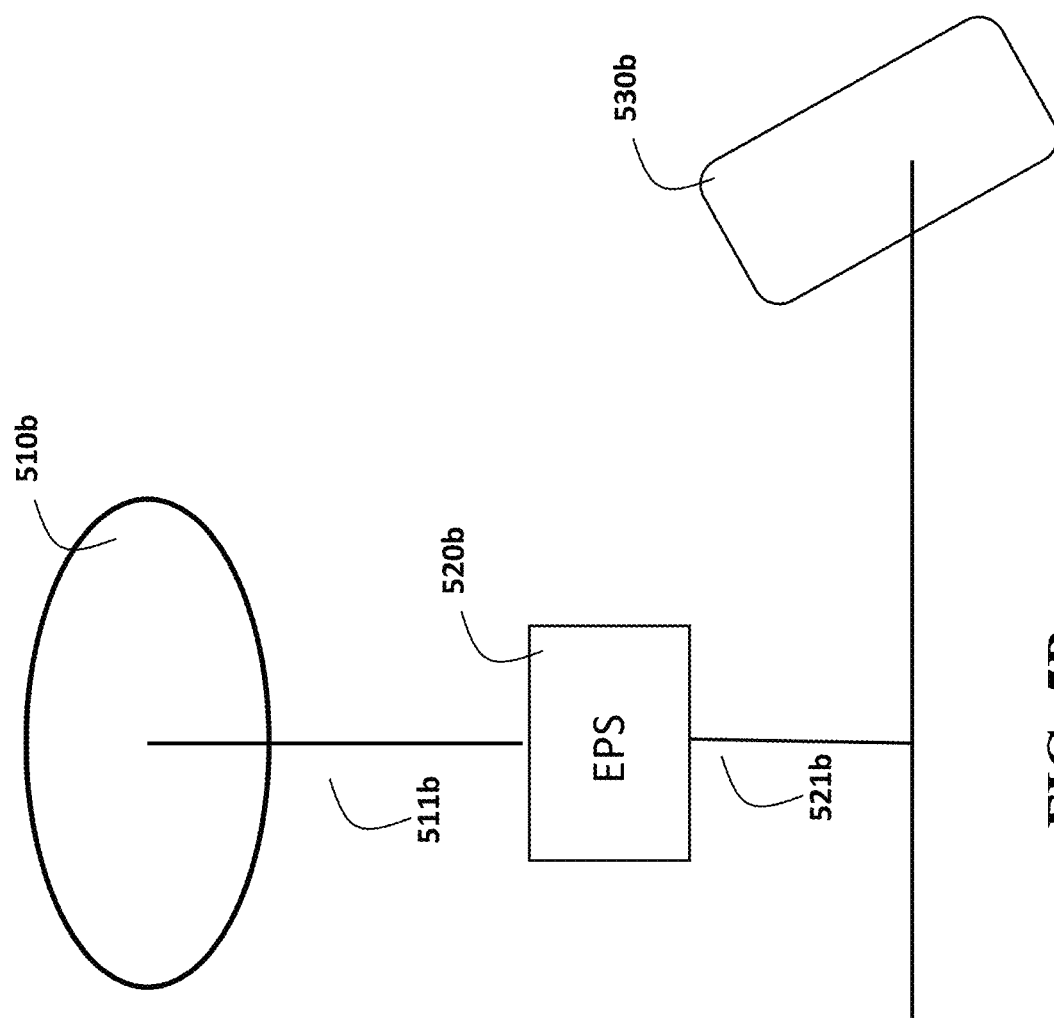
FIG. 5B is an illustration of how the sensor offset of a sensor varies with placement of sensor.

FIG. 5B shows an illustration of how the sensor offset of a sensor of vehicle typically varies with placement of the sensor. FIG. 5B shows a schematic of a construction of interaction between steering wheel 510b and the vehicle wheel 530b. The steering column is equipped with an electric power steering system 520b to help the driver steer the steering wheel. Also on the steering column is a sensor measuring the angle of the wheel. Depending on if the sensor is placed close 511b to the steering wheel or close 521b to the wheel, thereby directly measuring the wheel angle, different offsets will be obtained, as the mechanical construction between steering wheel 510b and vehicle wheel 530b are dynamically dependent and involves gear boxes and other mechanical parts.

Figure 5C:
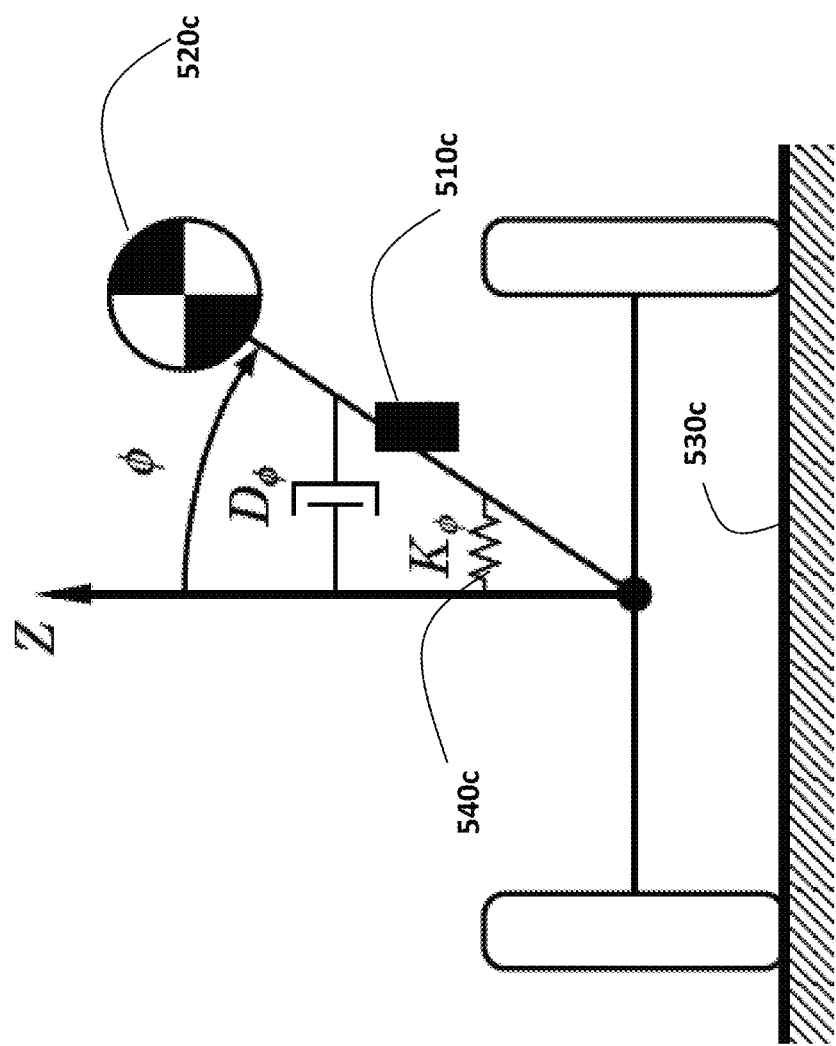
FIG. 5C is an illustration of how the sensor variance of a sensor varies with placement of sensor.

The variance of sensor measurements is also time varying, and to high extent also depends on where the sensor is located in the system. FIG. 5C shows an illustration of how the sensor variance of a sensor of a vehicle typically varies with placement of the sensor. For instance, placing an accelerometer 510c higher up relative to the center of mass 520c of the vehicle causes the accelerometer to also sense variations due to external factors, such as unevenness of the road surface 530c or the suspension system 540c in the vehicle. This causes the sensor to have an effective variance that differs from the intrinsic sensor variations, which yields estimation errors when not accounted for.

Consequently, one embodiment is based on the understanding that the sensors affecting the motion model of the system and the sensors affecting the measurement model of the system, often are affected by a time varying offset and uncertainty of the knowledge of the variation of the sensor measurements. Another embodiment is based on that the sensor can be modeled by a combination of a deterministic part and a stochastic part, where the stochastic part is modeled by a Gaussian distribution with unknown mean and variance. Various embodiments realize that the mean and the variance of the Gaussian distribution can be used to model the offset and the variation of the sensor measurements. Consequently, in one embodiment the sensor is calibrated by the determining the mean and the variance of the Gaussian disturbance.

The time evolution of the state of sensors is unknown, and any model of the motion of the state of sensors is therefore unknown and cannot be verified.

To that end, one embodiment recognizes that since the time evolution of the motion of the state of sensors is unknown, but that the unknown part is typically slowly time varying, the state of sensors should instead be treated as stochastic disturbances acting on the motion model and additionally or alternatively the measurement model. That is, instead of determining the state of the sensors explicitly, the distribution of the state of sensors is instead determined, thereby circumventing the need of a motion model of the state of sensors.

One embodiment of the invention realizes that the although the determining the state of sensor is complex and depend on effects that are intractable to model, the behavior of the sensor can be summarized in parameters representing an offset of the sensor and a variance of the sensor. For instance, returning to FIG. 5A, the constant part 510 and slowly time varying part 540 can be regarded as the offset of the sensor, whereas the part 530 depends on the motion of the system, with additional disturbance coining from the sensor noise of the sensor.

Knowledge of sensor offsets is useful in control, for example, electronic stability control of vehicles, where the lateral acceleration, heading rate, and steering angle of the vehicle wheel are used to control the vehicle. Without knowledge of the offsets, the controller of the vehicle will determine control inputs to the vehicle based on an erroneous vehicle model.

Knowledge of the variance of the sensor measurements is also useful in control. For instance, the variance can be used to determine how much to trust the sensor readings and adjust the control input in relation to the magnitude of the variation of the sensor measurements.

To this end, some embodiments are based on the realization that the offsets in the sensors can be included as the statistical mean value of a stochastic distribution, wherein the stochastic distribution defines the stochastic disturbance with which the state of sensor is described, and that the sensor noise can be included as the variation of the sensor measurements around the mean value of the stochastic distribution. Yet other embodiments are based on the realization that the modeling of the sensors as stochastic distributions can be used in a motion model of the system and a measurement model of the state of the system. In other embodiments, the mean and variance of the state of sensor is transformed to a Student-t distribution, to account for the uncertainty of the probabilistic parameters.

Figure 6A:
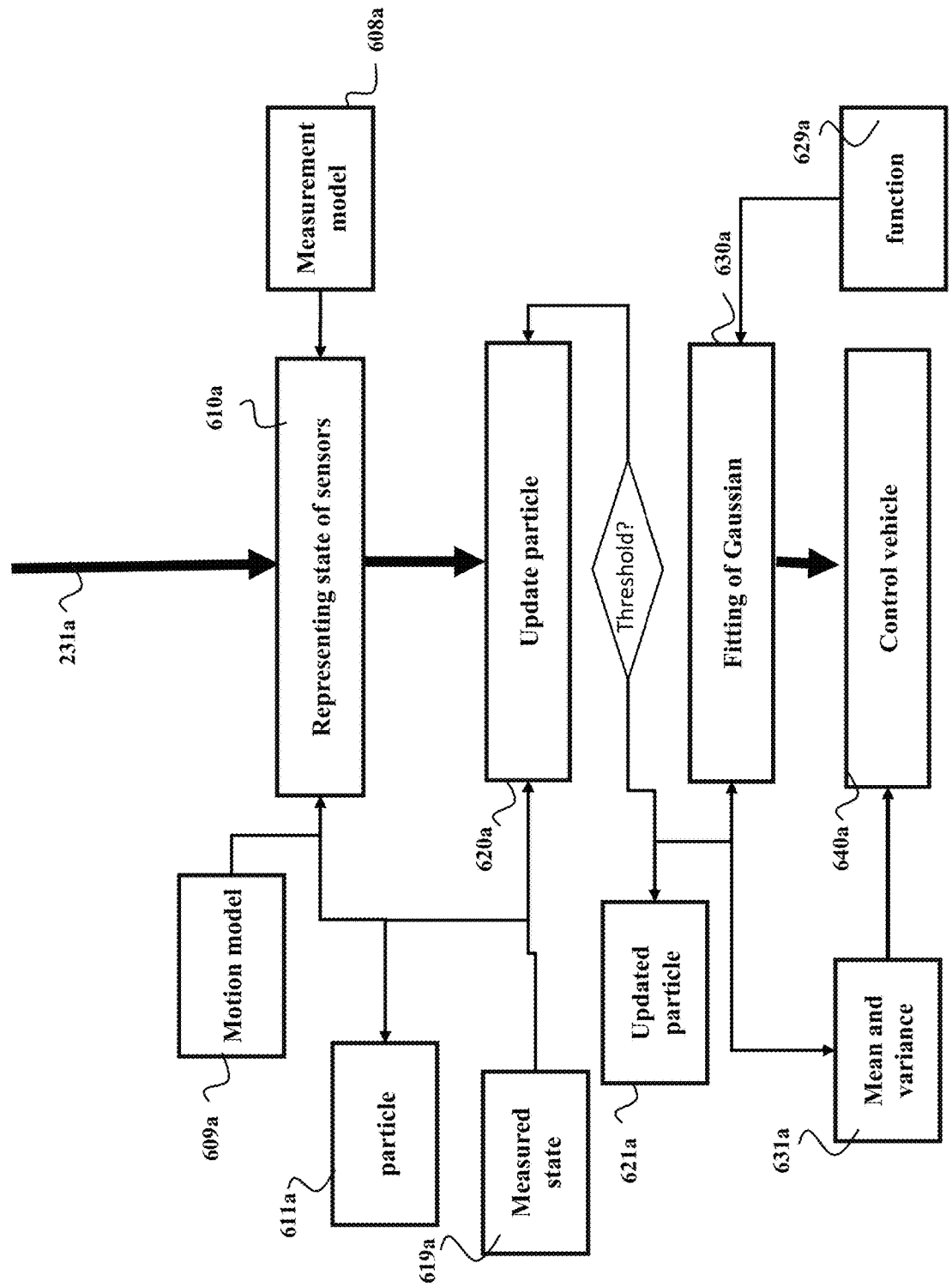
FIG. 6A shows a flowchart of a method for controlling a system by jointly estimating a state of a system and state of senor of the system according to one embodiment of the invention.

FIG. 6a shows a flowchart of a method for controlling a system by jointly estimating a state of a system, e.g., a velocity and a heading rate of the system, and state of senor of the system according to one embodiment of the invention. One embodiment is based on recognition that the unknown state of sensor of at least one sensor, can be regarded as stochastic disturbances acting on a, otherwise deterministic, model of a motion of the vehicle. In accordance with FIG. 4D, the nature of the stochastic disturbance causes the system to have different possible motions, and therefore different possible states. For instance, an input to a motion model is measured by a noisy sensor of the vehicle.

To that end, the embodiment represents 610a the state of sensor and the state of the system with a particle 611a. The particle includes a state of the system, which can be a measured state or the state determined during a previous iteration of the joint estimation. Additionally, or alternatively, the particle includes a mean, degree of freedom, and scale of the state of the system, and a mean, the offset, and scale, the noise of the sensor, of the stochastic disturbance defining a feasible space of the state of sensors. Representing the state of sensors probabilistically, i.e., using the mean, degree of freedom, and the scale allows considering the stochastic disturbance as a Student-t on the motion of the vehicle. To that end, the embodiment uses the mean of the feasible space of the state of sensors as input to the motion model 609a defined by the parameters, the mean, degree of freedom, and the scale, of the sensor characteristics and use the mean of the state of sensors in the joint estimation. In other embodiments, when the state of sensor of the measurements affect the motion model, one embodiment uses the mean of the feasible space of the state of sensor in combination with a weighted difference of the estimated state and the measured state.

Figure 6B:
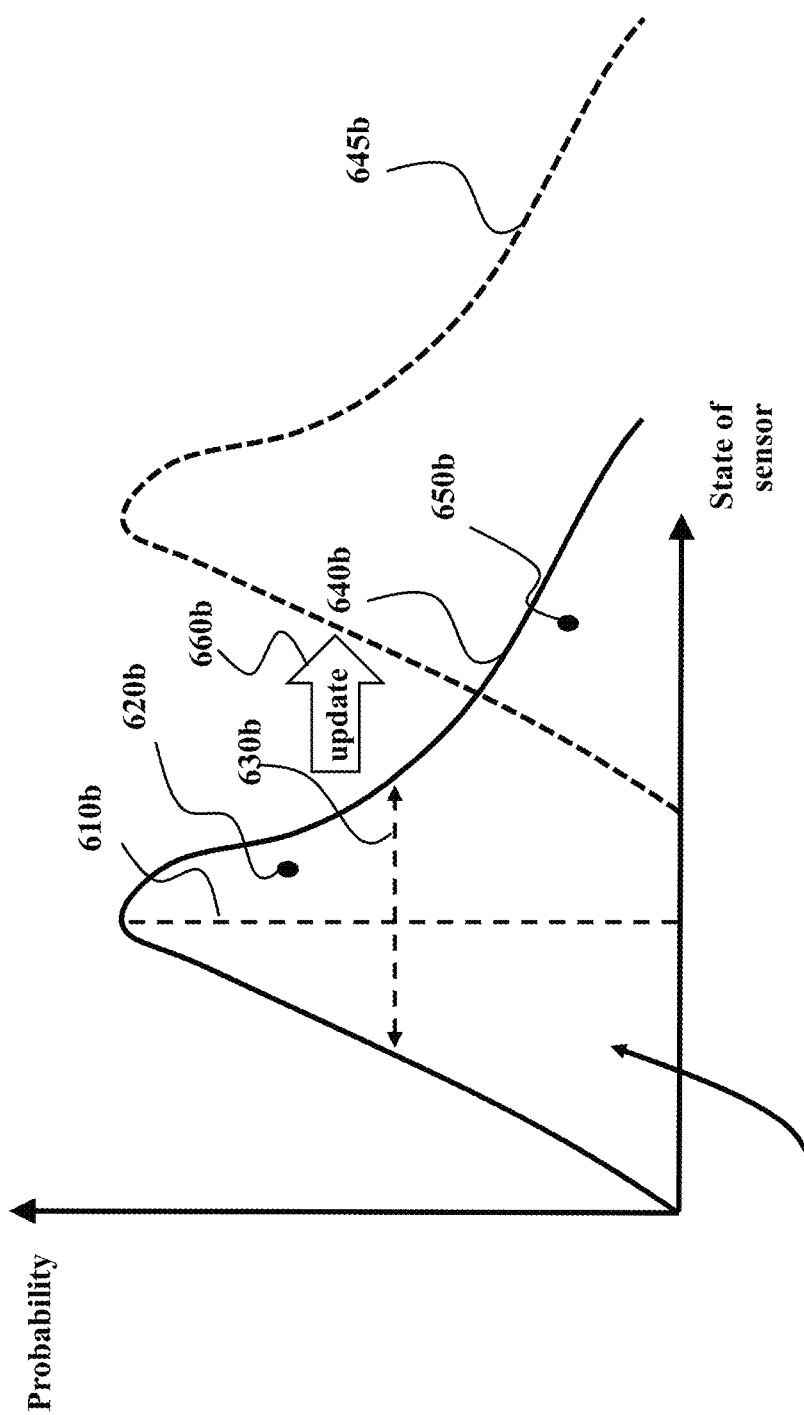
FIG. 6B shows a graph illustrating probability distribution function defining the feasible space of the state of sensor.

FIG. 6B shows a graph illustrating probability distribution function 640b defining the feasible space 600b of the state of sensor. The shape of the function 640b can be determined in advance. For example, if the distribution of the state of sensor is Gaussian, the shape of the distribution 640b is the "Gaussian hat" shape. If the shape is fixed, the mean 610b and the variance 630b define the distribution 640b and the feasible space 600b from which the the state of sensor can be contained. In some embodiments, the feasible space 600b is defined by a mean, degree of freedom, and scale.

According to the distribution 640b, the probability of a value 620b to be the correct state of sensor is higher than the probability of 650b. Such a representation allows updating 660b the mean and the variance of the state of sensor to produce an updated distribution 645b defining updated feasible space for the state of sensor. This embodiment is based on observation that the update of the mean and the variance of the state of sensor influence the value of the parameter of the state of sensor used in the subsequent iteration, because such a parameter forms the basis of the updated distribution.

To that end, the method updates 620a the particle, including the mean, scale, and degree of freedom of the state of sensor to produce the updated particle 621a. For example, the embodiment updates iteratively the mean and the scale of the particle using a difference between a state estimated using probabilistic parameters of the feasible space of the particle and a mean and a scale of a measured state 619a of sensor determined from measurements of the state of the vehicle according to a measurement model 608a that can include the state of sensor.

Next, the method fits 630a a Gaussian distribution representing the feasible space of the state of sensor into the Student-t distribution of the feasible space of the state of sensor to produce the mean and the variance 631a of the state of sensor.

In one implementation, the method determines a probability distribution of the state of the vehicle and the state of the sensor using a probability distribution of the measurement model centered on the measured state. The probability distribution of the measurement model can be determined in advance, for example, using the values of state of sensor determined during previous time instants. Next, the method determines the probability of the particle to represent the true state of the sensor according to a placement of the mean in the particle on the probability distribution of the state of the vehicle and the state of the sensor, and adjusts the particle to better represent the true state of sensor. Such a probability and adjusting is used by the function 629a in determining the output 631a.

Figure 6C:
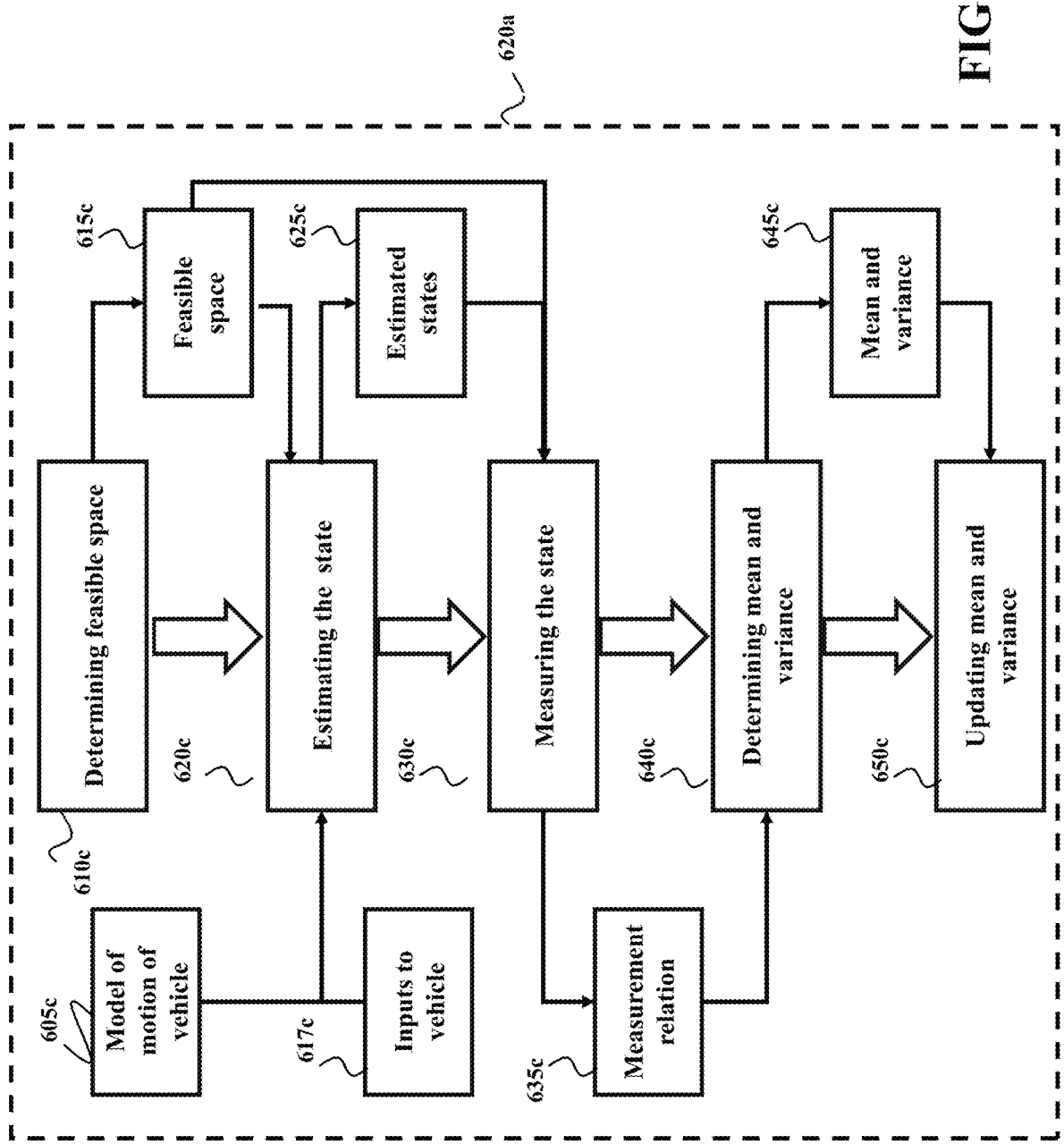
FIG. 6C shows a block diagram of one iteration of a method for updating the particle according to one embodiment that updates the particle iteratively.

FIG. 6C shows a block diagram of one iteration of a method for updating the particle 620a according to one embodiment that updates the particle iteratively. The method can be implemented using a processor of the vehicle. The method determines 610c a feasible space of possible parameters to be used in a model of the motion of the vehicle to produce a Student-t distribution including the probabilistic parameters 615c, that is, the mean, scale, and degree of freedom. The model 605c of the motion of the vehicle includes an uncertainty on the motion of the vehicle due to the uncertainty in the state of sensor affecting the motion model. The method estimates 620c, using the model 605c of the motion of the vehicle and inputs 617c to the system, a possible state 625c arising due to the Student-t distribution that affects the motion of the vehicle.

Next, the method measures the state 630*c*. For example, the method measures such a state of the vehicle that depends on the state of the sensor. The method maps the measurements to a model of the measurement relating the state of the vehicle and the state of sensor of at least one sensor, to produce a relation 635*c* between the measurement, the state of the vehicle, and the state of sensor. The method determines 640*c* the offset of the sensor as the statistical mean of the state of sensor for the particle that results in the measured state of the vehicle according to the measurement model 635*c*. The method also determines 640*c* the scale of the measured state of sensor resulting from the state of sensor as a difference between the estimated state and the measurement, additionally or alternatively as a difference between the estimated state and the deterministic part of the motion model that would lead to the state were no unknown state of sensor present. The determined 645*c* mean and scale of the state of sensor are used 650*c* to updating the offset as a combination of the statistical mean of the state of sensor in the particle using the mean of the measured state of sensor resulting in the measured state of the vehicle and the mean determined during previous iterations. Similarly, the method updates 650*c* the scale of the state of sensor in the particle using a combination of the scale of the measured state of sensor and the scale determined during previous iterations In one embodiment, a subset of the measurements has known variance and offset, that is, known parameters, which have been determined a priori or by some other method. In that case, the measurement with known variance and offset can be used to improve the estimation of the mean and scale of the sensor characteristics of the sensors with unknown parameters, by using the sensor with known parameters to estimate parts of the state of the vehicle. In one embodiment, the mean and variance of the sensor with known parameters are transformed to a mean, degree of freedom, and scale according to other embodiments before used in the determining the state of sensor.

Figure 7A:
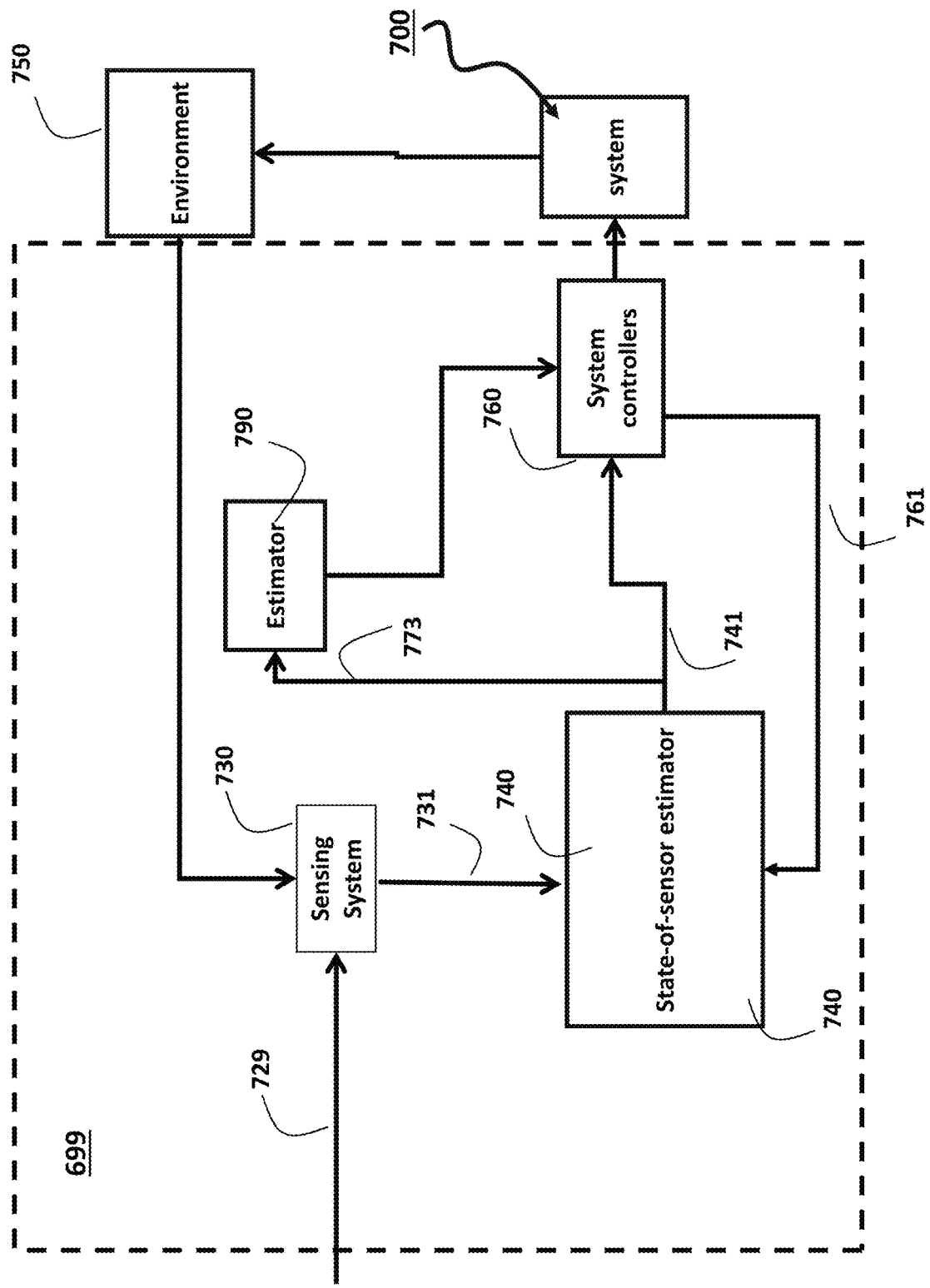
FIG. 7A illustrates a general block diagram of a control system according to one embodiment.

FIG. 7A illustrates a general block diagram of a control system 699. Different component of the control system 699 can be implemented using one or several processors operatively connected to a memory and/or various types of sensors of the system. The control system 699 can be internal to the system 700 and the implementation of the different components of the control system 699 in general depends on the type of the system.

The control system 699 can include a sensing system 730 that measures information about the motion of at least some parts of the system. The sensing system 730 can also receive sensing information 729 from external sources.

The control system 199 also includes a state-of-sensor estimator 740 for determining parameters of the state of sensors, for example, the sensors in 730. In some embodiments of the invention, the state-of-sensor estimator iteratively determines the state of the system and the probabilistic parameters representing the state of sensor, from a state of the system and probabilistic parameters of state of sensors determined during previous iterations.

The state-of-sensor estimator 740 uses information 731 from the sensing system. The state-of-sensor estimator 740 can also receive information 761 about the system motion from the system-control units 760. The information can include a state of the system, and is received either from hardware or software, connected directly or remotely to the machine.

For example, the state-of-sensor estimator can output the state of sensor 741 including offset values, certainty levels of the offsets, and variances of the noise of the measurements, or combinations thereof. The control system 699 also includes system controllers 760 that use the state of sensor information 741. For example, if the system is a road vehicle, in one embodiment, the offset is used in an advanced driver-assistance system (ADAS) that utilizes a model of the dynamics of the vehicle, which depends on the state of offsets of the sensors. In such a case, the vehicle controllers 760 can include stand-alone components, or a combination of vehicle controllers that enable autonomous driving features. The offsets and variances, which describe the state of sensor, can be used as input to estimators 790 of the vehicle, for example, a state estimator.

Figure 7B:
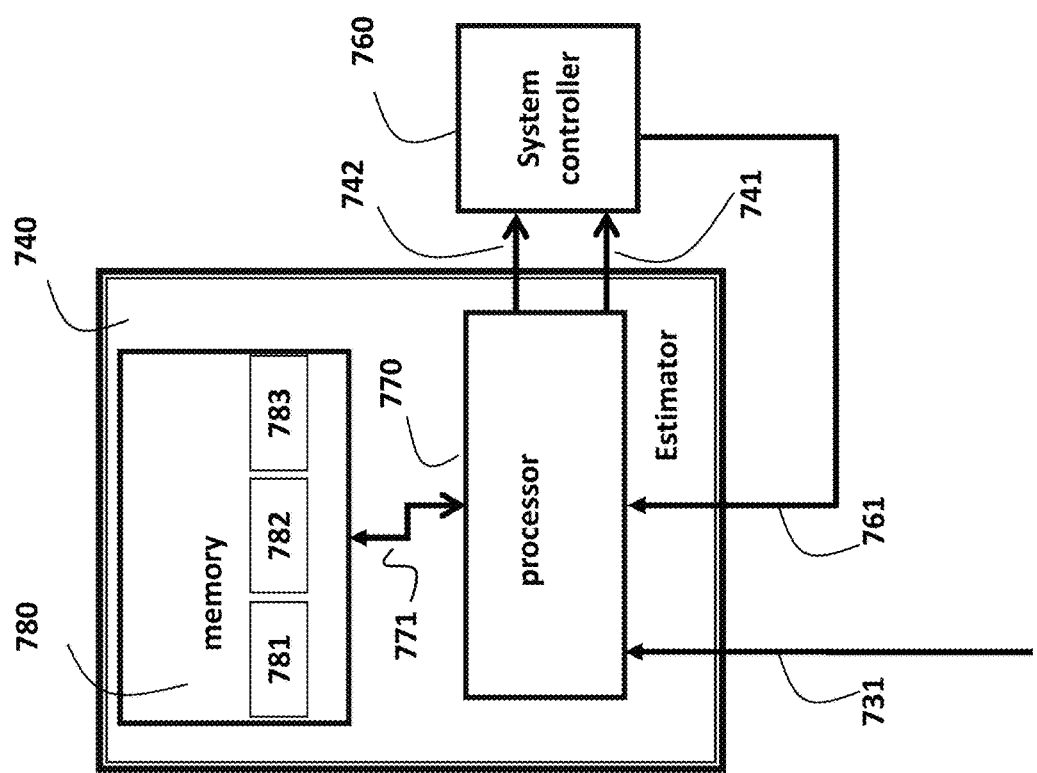
FIG. 7B shows a general structure of the state-of-sensor estimator according to one embodiment.

FIG. 7B shows a general structure of the state-of-sensor estimator 740 according to one embodiment of the invention. The state-of-sensor estimator 740 includes at least one processor 770 for executing modules of the state-of-sensor estimator 740. The processor 770 is connected 771 to a memory 780 that stores the statistics 781 of the states and parameters and the system information 782, such as the motion model and a measurement mode, wherein the motion model includes a combination of a deterministic component of the motion and a probabilistic component of the motion, wherein the deterministic component of the motion is independent from the state of sensor and defines the motion of the system as a function of time, wherein the probabilistic component of the motion includes the state of sensor and defines disturbance on the motion of the system, wherein the measurement model of the vehicle includes a combination of a deterministic component of the measurement model independent from the state of sensor and a probabilistic component of the measurement model that includes the state of sensor. The memory 780 also stores 783 the internal information of the estimator, including, but not limited to, values of the state of sensor, values of each computed state of the system, and the motion leading up to each state of the system. In some embodiments, the information on the system is updated 771 based on information received from the system 761 and the sensing 731.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. An apparatus for controlling a system, comprising:
a memory configured to store a model of the system including a motion model of the system subject to process noise and a measurement model of the system subject to measurement noise, such that one or a combination of the process noise and the measurement noise forms an uncertainty of the model of the system with unknown probabilistic parameters, wherein the uncertainty of the model of the system causes a state uncertainty of the system with unknown probabilistic parameters;
a sensor configured to measure a signal to produce a sequence of measurements indicative of a state of the system;
a processor configured to
estimate, using at least one or combination of the motion model, the measurement model, and the measurements of the state of the system, a first Student-t distribution representing the uncertainties of the model and a second Student-t distribution representing the state uncertainty of the system, the estimation is performed iteratively until a termination condition is met; and
fit a Gaussian distribution representing the state uncertainty into the second Student-t distribution; and
a controller to
determine a control input to the system using the model of the system with state uncertainty represented by the Gaussian distribution; and
control the system according to the control input, wherein the processor for performing an iteration of the joint estimate of the first and the second Student-t distributions, is configured to:
estimate, using the motion model, the state of the system, current values of the first Student-t distribution, and current values of the second Student-t distribution based on a previous estimation of the state of the system, previous values of the first Student-t distribution, and previous values of the second Student-t distribution; and
updating, using the measurements and the measurement model in response to receiving current values of the measurements, the current estimation of the state of the system, the current values of the first Student-t distribution, and the current values of the second Student-t distribution.

2. The apparatus of claim 1, wherein the processor, to determine initial values of the first and the second Student-t distributions, is configured to
determine initial estimates of the mean and the variance of a Gaussian distribution representing the uncertainty of the model;
fit the first Student-t distribution to the Gaussian distribution representing the uncertainty of the model to produce initial values of the mean, the scale, and the degree of freedom of the first Student-t distribution; and
estimate initial values of the mean, the scale, and the degree of freedom of the second Student-t distribution based on the initial values of the mean, the scale, and the degree of freedom of the first Student-t distribution.

3. The apparatus of claim 2, wherein the initial values of the second Student-t distribution equal the initial values of the first Student-t distribution, wherein, upon meeting the termination condition, the final values of the second Student-t distribution differ from the final values of the first Student-t distribution.

4. The apparatus of claim 2, wherein the initial estimate of the mean of the Gaussian distribution representing the uncertainty of the model is determined using an average value of historical measurements, and wherein the initial estimate of the variance of the Gaussian distribution representing the uncertainty of the model is determined using an average variation of the measurements measured by the sensor over a period of time.

5. The apparatus of claim 2, wherein the processor is configured to:
determine the initial value of the degree of freedom of the first Student-t distribution, wherein the initial value of the degree of freedom is a positive finite value greater than the dimension of the state of the system; and
determine the initial values of the mean and the scale of the first Student-t distribution for the determined initial value of the degree of freedom.

6. The apparatus of claim 5, wherein the processor is further configured to:
estimate a level of uncertainties of the model; and
select the initial value of the degree of freedom as a function of the level of uncertainties of the model.

7. The apparatus of claim 1, wherein a degree of freedom of the second Student-t distribution is finite after the termination condition is met, and wherein the processor fits the second Gaussian distribution into the second Student-t distribution using one or a combination of a moment matching and a similarity optimization.

8. The apparatus of claim 7, wherein the finite degree of freedom is selected as the smallest of the degrees of freedom of the first and second Student-t distributions.

9. The apparatus of claim 7, wherein the degree of freedom converges to a finite number.

10. The apparatus of claim 1, wherein the processor updates the first Student-t distribution and the second Student-t distribution and the Gaussian distribution representing the state uncertainty for each control step.

11. The apparatus of claim 1, wherein the controlled system is a vehicle, such that the apparatus controls the vehicle based on the state uncertainty of the vehicle represented by the Gaussian distribution.

12. The apparatus of claim 11, wherein the motion model of the system and the measurement model of the system are subject to disturbance caused by an uncertainty of a state of calibration of the sensor in the motion of the vehicle, wherein the processor is configured to
sample a feasible space of the state of calibration of the sensor defined by a probabilistic distribution to produce a set of sampled states of calibration of the sensor;
estimate, for each sampled state of calibration using the motion model, an estimation of the current state of the vehicle to produce a set of estimated states of the vehicle;

estimate, for each estimated state of the vehicle, an estimated state of calibration of the sensor by inserting the measurements and the estimated state of the vehicle into the measurement model;

update the mean and the variance of the probabilistic distribution of the state of calibration of the sensor stored in the memory based on a function of the sampled states of calibration weighted with weights determined based on a difference between the sampled state of calibration and the corresponding estimated state of calibration; and determine the Gaussian distribution using the updated probabilistic distribution of the state of calibration of the sensor.

13. The apparatus of claim 12, wherein the mean of the updated probabilistic distribution of the state of calibration of the sensor is an offset of the sensor, and wherein the variance of the updated probabilistic distribution of the state of calibration of the sensor is a variance of the sensor.

14. A method for controlling a system, wherein the method uses a processor coupled with stored instructions implementing the method, wherein the instructions, when executed by the processor carry steps of the method, comprising:

retrieving a model of the system including a motion model of the system subject to process noise and a measurement model of the system subject to measurement noise, such that one or combination of the process noise and the measurement noise forms an uncertainty of the model of the system with unknown probabilistic parameters, wherein the uncertainty of the model of the system causes a state uncertainty of the system with unknown probabilistic parameters;

receiving a sequence of measurements indicative of a state of the system;

estimating, using at least one or combination of the motion model, the measurement model, and the measurements of the state of the system, a first Student-t distribution representing the uncertainties of the model and a second Student-t distribution representing the state uncertainty of the system, wherein the estimating is performed iteratively until a termination condition is met;

fitting a Gaussian distribution representing the state uncertainty into the second Student-t distribution;

determining a control input to the system using the model of the system with state uncertainty represented by the Gaussian distribution; and controlling the system according to the control input, wherein performing an iteration of the joint estimate of the first and the second Student-t distributions comprises:

estimating, using the motion model, the state of the system, current values of the first Student-t distribution, and current values of the second Student-t distribution based on a previous estimation of the state of the system, previous values of the first Student-t distribution, and previous values of the second Student-t distribution; and updating, using the measurements and the measurement model in response to receiving current values of the measurements, the current estimation of the state of the system, the current values of the first Student-t distribution, and the current values of the second Student-t distribution.

15. The method of claim 14, further comprising:

determining initial estimates of the mean and the variance of a Gaussian distribution representing the uncertainty of the model;

fitting the first Student-t distribution to the Gaussian distribution representing the uncertainty of the model to produce initial values of the mean, the scale, and the degree of freedom of the first Student-t distribution; and estimating initial values of the mean, the scale, and the degree of freedom of the second Student-t distribution based on the initial values of the mean, the scale, and the degree of freedom of the first Student-t distribution.

16. The method of claim 15, wherein the initial values of the second Student-t distribution equal the initial values of the first Student-t distribution, wherein, upon meeting the termination condition, the final values of the second Student-t distribution differ from the final values of the first Student-t distribution.

17. The method of claim 14, wherein the controlled system is a vehicle, such that the apparatus controls the vehicle based on the state uncertainty of the vehicle represented by the Gaussian distribution.

18. The method of claim 17, wherein the motion model of the system and the measurement model of the system are subject to disturbance caused by an uncertainty of a state of calibration of a sensor in the motion of the vehicle, further comprising:

sampling a feasible space of the state of calibration of the sensor defined by a probabilistic distribution to produce a set of sampled states of calibration of the sensor;

estimating, for each sampled state of calibration using the motion model, an estimation of the current state of the vehicle to produce a set of estimated states of the vehicle;

estimating, for each estimated state of the vehicle, an estimated state of calibration of the sensor by inserting the measurements and the estimated state of the vehicle into the measurement model;

updating the mean and the variance of the probabilistic distribution of the state of calibration of the sensor stored in the memory based on a function of the sampled states of calibration weighted with weights determined based on a difference between the sampled state of calibration and the corresponding estimated state of calibration; and determining the Gaussian distribution using the updated probabilistic distribution of the state of calibration of the sensor.

19. A non-transitory computer readable storage medium embodied thereon a program executable by a processor for performing a method, the method comprising:

retrieving a model of the system including a motion model of the system subject to process noise and a measurement model of the system subject to measurement noise, such that one or combination of the process noise and the measurement noise forms an uncertainty of the model of the system with unknown probabilistic parameters, wherein the uncertainty of the model of the system causes a state uncertainty of the system with unknown probabilistic parameters;

receiving a sequence of measurements indicative of a state of the system;

estimating, using at least one or combination of the motion model, the measurement model, and the measurements of the state of the system, a first Student-t distribution representing the uncertainties of the model and a second Student-t distribution representing the state uncertainty of the system, wherein the estimating is performed iteratively until a termination condition is met;

fitting a Gaussian distribution representing the state uncertainty into the second Student-t distribution;

determining a control input to the system using the model of the system with state uncertainty represented by the Gaussian distribution; and controlling the system according to the control input, wherein performing an iteration of the joint estimate of the first and the second Student-t distributions comprises:

estimating, using the motion model, the state of the system, current values of the first Student-t distribution, and current values of the second Student-t distribution based on a previous estimation of the state of the system, previous values of the first Student-t distribution, and previous values of the second Student-t distribution; and updating, using the measurements and the measurement model in response to receiving current values of the measurements, the current estimation of the state of the system, the current values of the first Student-t distribution, and the current values of the second Student-t distribution.

* * * * *